(12) United States Patent
Im et al.

(10) Patent No.: US 9,646,971 B2
(45) Date of Patent: May 9, 2017

(54) SEMICONDUCTOR DEVICES INCLUDING NANOWIRE CAPACITORS AND FABRICATING METHODS THEREOF

(71) Applicant: Samsung Electronics Co., Ltd., Suwon-si, Gyeonggi-do (KR)

(72) Inventors: Dong-Hyun Im, Suwon-si (KR); Han-Jin Lim, Seoul (KR); Jin-Won Ma, Hwaseong-si (KR); Kong-Soo Lee, Hwaseong-si (KR); Ki-Vin Im, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/162,912

(22) Filed: May 24, 2016

(65) Prior Publication Data
US 2017/0062435 A1    Mar. 2, 2017

(30) Foreign Application Priority Data
Aug. 26, 2015 (KR) ........................ 10-2015-0120183

(51) Int. Cl.
| | |
|---|---|
| *H01L 27/108* | (2006.01) |
| *H01L 23/535* | (2006.01) |
| *H01L 23/528* | (2006.01) |
| *H01L 23/532* | (2006.01) |
| *H01L 23/522* | (2006.01) |
| *H01L 29/06* | (2006.01) |

(52) U.S. Cl.
CPC ...... *H01L 27/10814* (2013.01); *H01L 23/528* (2013.01); *H01L 23/5226* (2013.01); *H01L 23/535* (2013.01); *H01L 23/53257* (2013.01); *H01L 23/53261* (2013.01); *H01L 23/53271* (2013.01); *H01L 27/10823* (2013.01); *H01L 29/0676* (2013.01)

(58) Field of Classification Search
CPC .............................. H01L 27/10814–27/10897
See application file for complete search history.

(56) References Cited

U.S. PATENT DOCUMENTS

| | | | |
|---|---|---|---|
| 7,659,164 B1 | 2/2010 | Yoo | |
| 7,906,803 B2 | 3/2011 | Shioya et al. | |
| 7,939,404 B2 | 5/2011 | Jang | |
| 2003/0189202 A1* | 10/2003 | Li | B82Y 10/00 257/14 |
| 2008/0142866 A1 | 6/2008 | Choi et al. | |
| 2008/0315430 A1* | 12/2008 | Weber | B82Y 10/00 257/774 |
| 2012/0306319 A1 | 12/2012 | Park | |
| 2016/0064277 A1* | 3/2016 | Park | H01L 27/10817 438/386 |

FOREIGN PATENT DOCUMENTS

| | | |
|---|---|---|
| JP | 2013-165220 | 8/2013 |
| KR | 1020060023064 | 3/2006 |
| KR | 100849685 | 7/2008 |
| KR | 1020100031386 | 3/2010 |
| KR | 20160025391 | 3/2016 |

* cited by examiner

Primary Examiner — Daniel Shook
(74) Attorney, Agent, or Firm — Myers Bigel, P.A.

(57) ABSTRACT

Semiconductor devices and fabricating methods thereof are provided. A semiconductor device may include a substrate, a metal layer on the substrate, a seed layer on the metal layer, a nanowire including a pillar shape on the seed layer, a dielectric film conformally covering the nanowire, and an electrode film on the dielectric film.

20 Claims, 25 Drawing Sheets

3300

3400

US 9,646,971 B2

SEMICONDUCTOR DEVICES INCLUDING NANOWIRE CAPACITORS AND FABRICATING METHODS THEREOF

CROSS-REFERENCE TO RELATED APPLICATION

The present application claims priority under 35 U.S.C. §119 to Korean Patent Application No. 10-2015-0120183, filed on Aug. 26, 2015 in the Korean Intellectual Property Office, the disclosure of which is hereby incorporated herein by reference in its entirety.

FIELD

The present disclosure relates to semiconductor devices and, more particularly, semiconductor devices including capacitors and fabricating methods thereof.

BACKGROUND

Capacitors may store charges in a semiconductor device. A sufficient area may be provided for the capacitors to provide a sufficiently high capacitance to provide for operation of the semiconductor device. A unit cell size may decrease with high integration of a semiconductor device. Accordingly, a high aspect ratio structure may be employed to provide sufficient capacitor area. However, a top-down technology based on conventional capacitor forming methods, such as photolithography and etching process, may result in increased cost due to increased mold height and decreased hole size.

SUMMARY

A technical object is to provide a semiconductor device which achieves high integration density by use of nanowires. Another technical object is to provide a fabricating method of a semiconductor device which achieves high integration density by use of nanowires. The objectives that are intended to be addressed by the present disclosure are not limited to those mentioned above, and other objectives that are not mentioned above may be clearly understood to those skilled in the art based on the description provided below.

According to some embodiments of the inventive concepts, semiconductor devices are provided. A semiconductor device may include a substrate, a metal layer on the substrate, a seed layer on the metal layer, a nanowire including a pillar shape on the seed layer, a dielectric film conformally covering the nanowire, and an electrode film on the dielectric film.

In some embodiments, a shape of a lower surface of the nanowire may conform to a shape of an upper surface of the seed layer.

In some embodiments, the nanowire may include at least one of ZnO, doped ZnO, GaAs, InP, and Si.

In some embodiments, the seed layer may include at least one of graphene, nanocrystalline graphene and amorphous carbon.

In some embodiments, the semiconductor device may further include an interlayer insulating film. The metal layer may pass through the interlayer insulating film.

In some embodiments, the semiconductor device may further include a guide pattern through which the nanowire passes. A distance from an upper surface of the guide pattern to the substrate may be less than a distance from the upper surface of the nanowire to the substrate.

In some embodiments, the semiconductor device may further include an oxide layer under the guide pattern. The oxide layer may surround a portion of the metal layer that is adjacent to the seed layer.

In some embodiments, a distance from an upper surface of the oxide layer to the substrate may be greater than a distance from an upper surface of the metal layer to the substrate.

In some embodiments, the semiconductor device may further include a gate electrode within the substrate, a first source/drain region and a second source/drain region in the substrate on opposing side surfaces of the gate electrode, and a bit line on the substrate. The bit line may be electrically connected to the first source/drain region. The metal layer may be electrically connected to the second source/drain region.

In some embodiments, the semiconductor device may further include a contact plug between the metal layer and the second source/drain region that electrically connects the metal layer to the second source/drain region. The contact plug may include polysilicon.

According to some embodiments of the present inventive concepts, semiconductor devices are provided. A semiconductor device may include a substrate, a gate electrode in the substrate, a first source/drain region and a second source/drain region in the substrate on opposing sides of the gate electrode, a bit line on the substrate that is electrically connected to the first source/drain region, a metal layer that is electrically connected to the second source/drain region, a nanowire including a pillar shape on the metal layer, a dielectric film conformally covering the nanowire, and an electrode film on the dielectric film.

In some embodiments, the semiconductor device may further include a seed layer between the metal layer and the nanowire.

In some embodiments, the semiconductor device may further include a device isolating region in the substrate that defines an active region in the substrate and a trench in the active region. The gate electrode may fill at least a portion of the trench.

In some embodiments, the nanowire may include a lower portion and an upper portion on the lower portion. The upper portion may be surrounded by the dielectric film. The semiconductor device may further include a guide pattern surrounding the lower portion.

In some embodiments, the semiconductor device may further include an oxide layer between the guide pattern and the substrate. The oxide layer may, surround at least an upper portion of the metal layer.

According some embodiments of the present inventive concepts, semiconductor devices are provided. A semiconductor device may include a substrate, a device isolating region in the substrate that defines an active region in the substrate, a gate electrode in the active region of the substrate, a first source/drain region and a second source/drain region in the active region of the substrate on opposing side surfaces of the gate electrode, a bit line on the substrate that is electrically connected to the first source/drain region, a contact plug including polysilicon on the substrate that is electrically connected to the second source/drain region, a metal layer including a polycrystalline metal on the contact plug, a seed layer including a carbon-based material on the metal layer, a nanowire on the seed layer that extends away from the substrate, a dielectric film conformally covering the nanowire, and an electrode film on the dielectric film.

In some embodiments, the semiconductor device may further include a guide pattern on the substrate that surrounds a lower portion of the nanowire that is adjacent to the seed layer. The guide pattern may include an electrically insulating material.

In some embodiments, the semiconductor device may further include an oxide layer between the guide pattern and the substrate. The oxide layer may surround at least an upper portion of the metal layer that is adjacent the seed layer. The oxide layer may include the polycrystalline metal of the metal layer that has been oxidized to be electrically insulating.

In some embodiments, the gate electrode may be a first gate electrode, the contact plug may be a first contact plug, the metal layer may be a first metal layer, the seed layer may be a first seed layer, and the nanowire may be a first nanowire. The semiconductor device may further include a second gate electrode in the active region of the substrate, a third source/drain region in the active region of the substrate on an opposing side surface of the second gate electrode from the first source/drain region, a second contact plug comprising polysilicon on the substrate that is electrically connected to the third source/drain region, a second metal layer comprising the polycrystalline metal on the second contact plug, a second seed layer comprising the carbon-based material on the second metal layer, and a second nanowire on the second seed layer that extends away from the substrate. The dielectric film may conformally cover the second nanowire. The electrode film may be on the dielectric film surrounding each of the first nanowire and the second nanowire.

In some embodiments, a first word line may include the first gate electrode. A second word line may include the second gate electrode. Each of the first word line and the second word line may extend parallel to each other in a first direction. The bit line may extend in a second direction that is perpendicular to the first direction. The active area may extend in a third direction that forms an acute angle with respect to each of the first and second directions.

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

BRIEF DESCRIPTION OF THE DRAWINGS

The above and other objects, features and advantages of the present disclosure will become more apparent to those of ordinary skill in the art by describing in detail embodiments of the inventive concepts thereof with reference to the accompanying drawings, in which.

DETAILED DESCRIPTION

Figure 1:
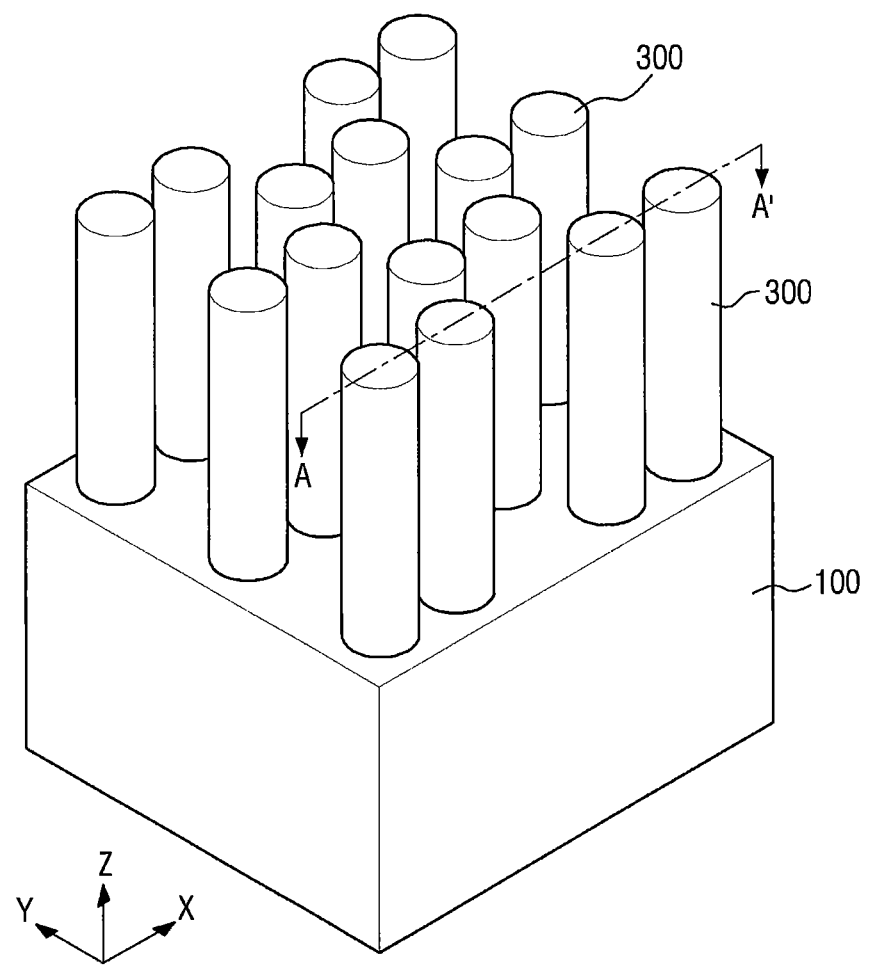
FIG. 1 is a perspective view schematically illustrating a semiconductor device according to some embodiments of the inventive concepts.

The present inventive concepts will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions may be exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Methods of fabricating semiconductor devices according to some embodiments of the inventive concepts will be explained with reference to FIGS. 1 and 2.

Figure 2:
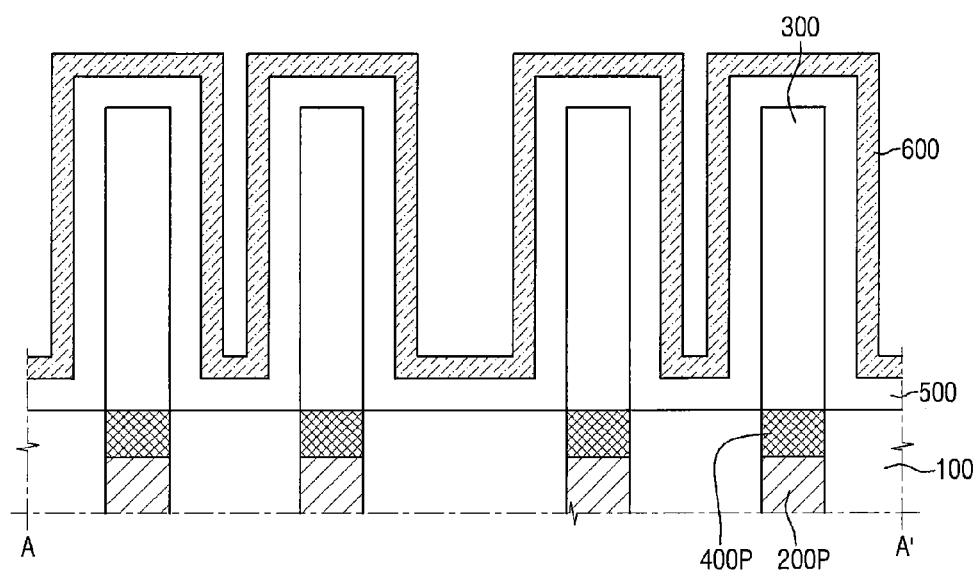
FIG. 2 is a cross sectional view taken on the line A-A' of FIG. 1.

FIG. 1 is a perspective view schematically illustrating a semiconductor device according to some embodiments of the inventive concepts, and FIG. 2 is a cross sectional view taken on the line A-A' of FIG. 1.

Referring to FIGS. 1 and 2, according to some embodiments of the inventive concepts, a semiconductor device may include an interlayer insulating film 100, nanowires 300, a metal layer 200P, a seed layer 400P, a dielectric film 500 and an electrode film 600.

The interlayer insulating film 100 may include a material having electrical insulating properties. For example, the interlayer insulating film 100 may include at least one of silicon oxide, silicon nitride and silicon oxynitride. The interlayer insulating film 100 may be a single layer or multi-layers.

The metal layer 200P may pass through the interlayer insulating film 100. The interlayer insulating film 100 may separate a plurality of metal layers 200P from one another. The interlayer insulating film 100 may separate a plurality of metal layers 200P from physical contact with each other, and may also separate the metal layers 200P from electrical connection.

The metal layer 200P may include polycrystalline metal. The polycrystalline metal may be formed as single crystals that are aggregated, and may have the respective single crystals oriented in different directions. Accordingly, it may not be suitable as a base that is used to grow the nanowires 300 in one direction without other structures.

The metal layer 200P may include, for example, at least one of tungsten (W), tungsten silicide ($WSi_2$) and TiN. However, embodiments of the inventive concepts are not limited thereto.

The metal layer 200P may be in a pillar shape or a polygonal column shape. That is, the metal layer 200P may be a column that extends in a longitudinal direction that extends longitudinally. The longitudinal direction may correspond to a direction that is perpendicular to a surface of the interlayer insulating film 100, but embodiments of the inventive concepts are not limited thereto.

In some embodiments, there may be a plurality of metal layers 200P. The metal layers 200P may be separated from one another by the interlayer insulating film 100. The metal layer 200P may pass through the interlayer insulating film 100. That is, the interlayer insulating film 100 may surround the side surface of the metal layer 200P.

The seed layer 400P may be formed on the metal layer 200P. The seed layer 400P may have the same width as the metal layer 200P. That is, the seed layer 400P and the metal layer 200P may have the same profile of side surface at an interface between the seed layer 400P and the metal layer 200P.

The seed layer 400P may serve as a seed on which the nanowire 300 can grow. That is, the seed layer 400P may be the starting point for the crystallites of the nanowire 300 to grow.

The seed layer 400P may include a carbon-based material such as graphene, nanocrystalline graphene, amorphous carbon, and so on. However, embodiments of the inventive concepts are not limited thereto.

The side surface of the seed layer 400P may be surrounded by the interlayer insulating film 100. That is, a stack structure of the seed layer 400P and the metal layer 200P may pass through the interlayer insulating film 100. FIG. 2 illustrates the upper surface of the seed layer 400P in the same plane as the upper surface of the interlayer insulating film 100, but embodiments of the inventive concepts are not limited thereto. Accordingly, the upper surface of the seed layer 400P may be lower, or higher than the upper surface of the interlayer insulating film 100.

The nanowires 300 may be formed on the seed layer 400P. The nanowires 300 may extend in a normal direction Z to the upper surface of the seed layer 400P. As used herein, a normal direction may refer to a direction that is perpendicular to a surface. For example, the normal direction Z may correspond to a direction that is perpendicular to the upper surface of the seed layer 400P. However, embodiments of the inventive concepts are not limited thereto.

The side surfaces of the nanowires 300 and the side surface of the seed layer 400P may have the same profile at an interface between the nanowires 300 and the seed layer 400P. That is, because the nanowires 300 grow on the seed layer 400P, the width of the nanowires 300 may be same as, or smaller than the width of the seed layer 400P. However, embodiments of the inventive concepts are not limited thereto.

The nanowires may include at least one of ZnO, doped ZnO (conductive ZnO that is doped with impurities such as Al, Ga, etc.), GaAs, InP, and Si. However, embodiments of the inventive concepts are not limited thereto.

The dielectric film 500 may cover the nanowires 300 and the interlayer insulating film 100. The dielectric film 500 may serve as a barrier between the nanowires 300 and the electrode film 600, which does not permit charges to pass therethrough. While blocking the charges from passing, the dielectric film 500 may be charged by the voltage differences between the nanowires 300 and the electrode film 600. The dielectric film 500 may be formed of $Al_2O_3$, $HfO_2$, lanthanide oxide, $ZrO_2$, $Ta_2O_5$, $TiO_2$, $SrTiO_3$, $BaSrTiO_3$ and so on, and a combination of these. However, embodiments of the inventive concepts are not limited thereto.

The electrode film 600 may be formed on the dielectric film 500. In cooperation with the dielectric film 500 and the nanowires 300, the electrode film 600 may form a capacitor. That is, together with the nanowires 300, the electrode film 600 may gather electrostatic charges. The electrode film 600 may include at least one of TiN, TaN, W, Ru and N, for example. However, embodiments of the inventive concepts are not limited thereto.

The nanowires 300, the dielectric film 500 and the electrode film 600 may form a capacitor structure. That is, the nanowires 300 and the electrode film 600 may serve as electrodes that are spaced apart from each other, and the dielectric film 500 may serve as a dielectric that is interposed between the nanowires 300 and the electrode film 600, allowing the respective electrodes to charge the capacitor structure.

Semiconductor devices according to some embodiments of the inventive concepts will be described with reference to FIGS. 3 to 5. Elements or operations overlapping with those described above with reference to FIGS. 1 and 2 may be mentioned briefly or omitted for the sake of brevity.

Figure 3:
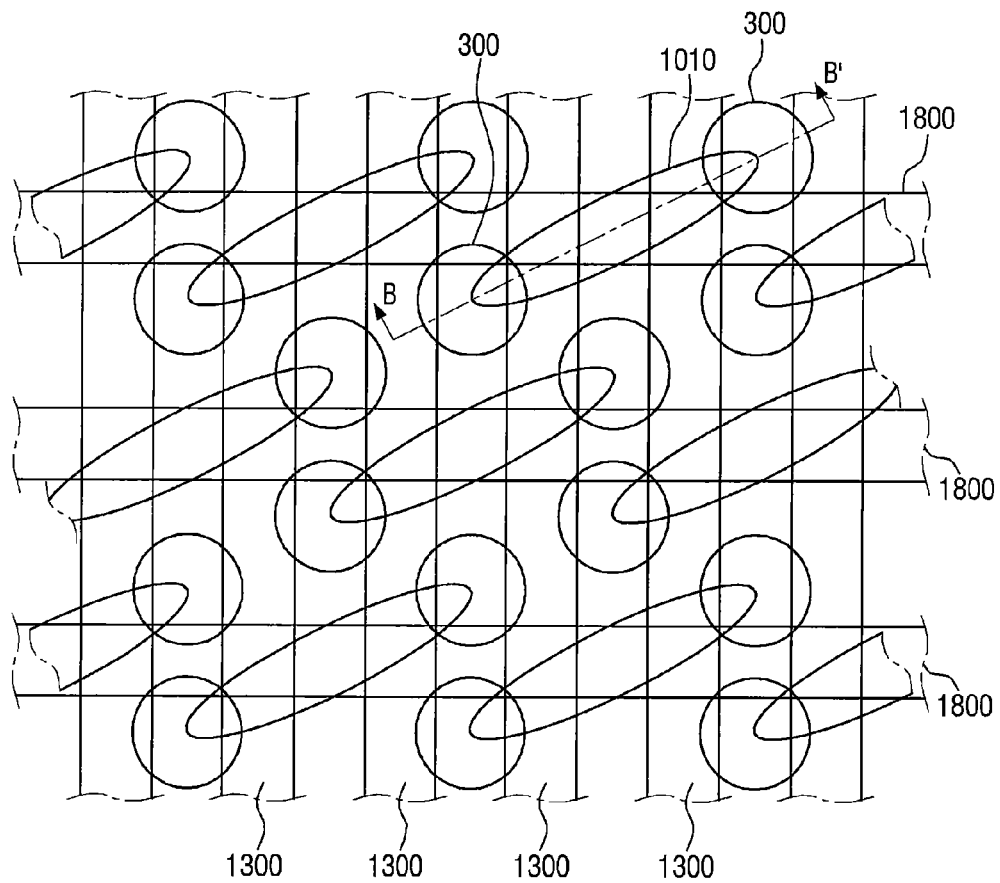
FIG. 3 is a layout diagram schematically illustrating a semiconductor device according to some embodiments of the inventive concepts.
Figure 4:
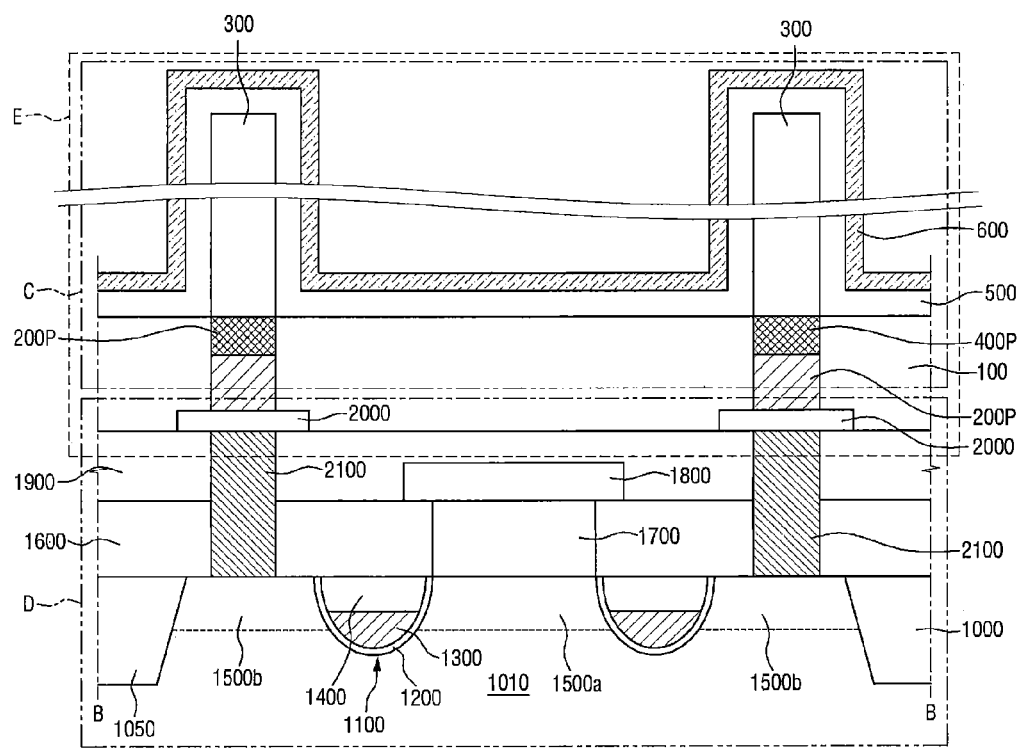
FIG. 4 is a cross sectional view taken on the line B-B' of FIG. 3.

FIG. 3 is a layout diagram schematically illustrating a semiconductor device according to some embodiments of the inventive concepts, and FIG. 4 is a cross sectional view taken on the line B-B' of FIG. 3. FIG. 5 is a circuit diagram schematically illustrating the semiconductor device of FIG. 3 according to some embodiments of the inventive concepts.

Figure 5:
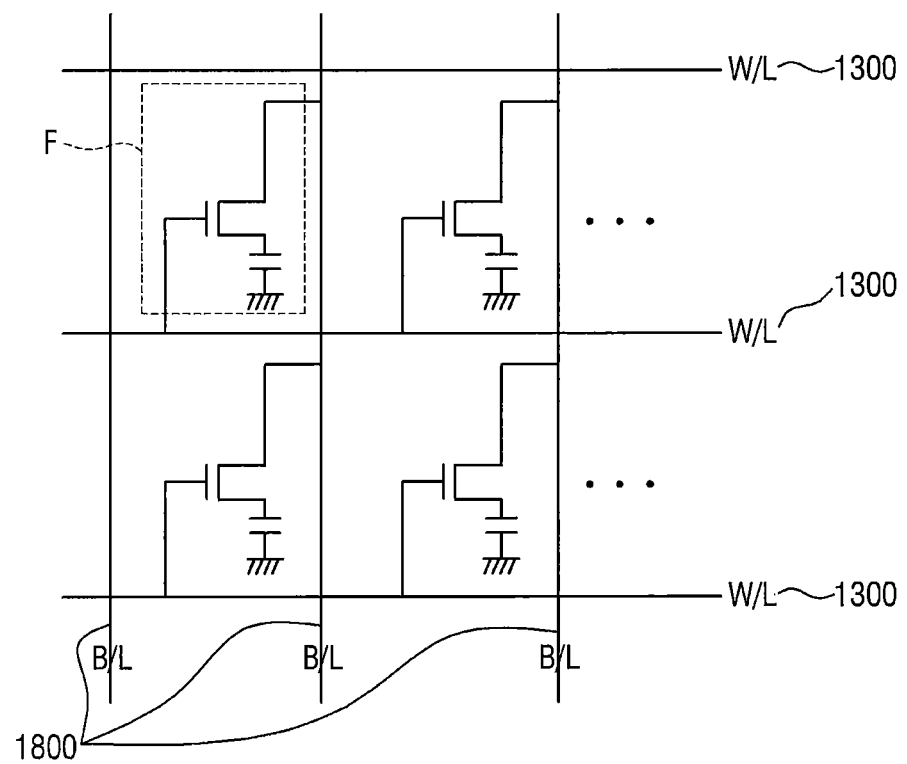
FIG. 5 is a circuit diagram schematically illustrating the semiconductor device of FIG. 3 according to some embodiments of the inventive concepts.

Referring to FIGS. 3 to 5, a semiconductor device according to some embodiments of the inventive concepts may further include a substrate 1000, a gate electrode 1300, a bit line 1800, and so on.

The substrate 1000 may be divided into a device isolating region 1050 and an active region 1010. The active region 1010 may be defined by the device isolating region 1050 in the substrate 1000.

Referring to FIG. 3, the active region 1010 may extend in a first direction DR1, the gate electrode 1030 (i.e., word line) may extend in an X direction that forms a first acute angle with the first direction DR1, and the bit line 1800 may extend in a Y direction that forms a second acute angle with the first direction DR1. In some embodiments, the X direction may be perpendicular to the Y direction. Lower electrodes 300 in cylindrical shape may be formed on opposing ends of the active region 1010.

As used herein, the angle in the statement "certain direction different from another certain direction is at a predetermined angle" refers to a smaller angle of the two angles formed between the two intersecting directions. For example, it refers to 60°, when 120° and 60° are the angles that can be made between two intersecting directions.

Accordingly, as illustrated in FIG. 1, the angle between the first direction DR1 and the X direction is θ1, and the angle between the first direction DR1 and the Y direction is θ2.

As described above, angles θ1 and/or θ2 may be made acute angles to provide maximum distance between a bit line contact 1700 connecting the active region 1010 with the bit line 1800, and a contact plug 2100 connecting the active region 1010 with memory device. For example, θ1 and θ2 may each be 45° and 45°, 30° and 60°, or 60° and 30°, but not limited thereto.

Specifically, the substrate 1000 may be a rigid substrate such as a silicon substrate, silicon on insulator (SOI) substrate, gallium arsenide substrate, silicon germanium substrate, ceramic substrate, quartz substrate, or glass substrate for use in display, or a substrate of flexible plastic such as polyimide, polyester, polycarbonate, polyethersulfone, polymethyl methacrylate, polyethylene naphthalate, polyethylene terephthalate, and so on.

Referring to FIG. 4, a buried trench 1100 may be formed in the active region 1010, and a gate insulating film 1200, the gate electrode 1300, and a capping pattern 1400 may be formed in order within the buried trench 1100.

A first source/drain region 1500a and a second source/drain region 1500b may be formed on opposing side surfaces of the buried trench 1100. The gate electrode 1300, the first source/drain region 1500a and the second source/drain region 1500b may operate as a buried channel array transistor (BCAT).

A first insulating layer 1600 may be formed on the BCAT, i.e., on the gate electrode 1300, the first source/drain region 1500a and the second source/drain region 1500b.

The bit line contact 1700 in contact with the bit line 1800 may pass through the first insulating layer 1600. A second insulating layer 1900 may cover the bit line 1800, and the contact plug 2100 in contact with a landing pad 2000 may pass through the second insulating layer 1900.

The contact plug 2100 may include polysilicon. The contact plug 2100 may include polysilicon, rather than metal, to minimize electrical resistance with the second source/drain region 1500b.

The metal layer 200P may include a metal to be connected to a capacitor, which is a structure of the nanowires 300, the dielectric film 500 and the electrode film 600. That is, the metal may be included to minimize electric resistance with the capacitor structure.

The landing pad 2000 may connect the metal layer 200P to the contact plug 2100. The landing pad 2000 may reduce difference of resistance between the polysilicon-containing contact plug 2100 and the metal-containing metal layer 200P. Further, the landing pad 2000 may provide a margin of a location where the metal layer 200P is formed.

However, the materials of the contact plug 2100 and the metal layer 200P are not limited to the example provided above. Accordingly, in some embodiments, the landing pad 2000 may be omitted, for example, depending on the materials of the contact plug 2100 and the metal layer 200P.

The interlayer insulating film 100 may be formed on the substrate 1000. Specifically, the interlayer insulating film 100 may be formed on the second insulating layer 1900 and the landing pad 2000. The interlayer insulating film 100 may be formed by using silicon oxide such as borosilicate glass (BSG), phosphosilicate glass (PSG), borophosphosilicate glass (BPSG), undoped silicate glass (USG), tetraethyl orthosilicate glass (TEOS), high density plasma CVD (HDP-CVD), and so on. As described above, the metal layer 200P may pass through the interlayer insulating film 100.

Referring to FIG. 5, a circuit diagram may represent a semiconductor device according to some embodiments of the inventive concepts in which word lines 1300 and bit lines 1800 form a lattice structure. A semiconductor device according to some embodiments of the inventive concepts may be a dynamic random access memory (DRAM) device which has a transistor and a capacitor between word lines 1300 and bit lines 1800 of the lattice structure.

Specifically, the gate insulating film 1200, the gate electrode 1300, and the capping pattern 1400, which are formed in the buried trench 1100, may form a gate of the transistor in the cell of an area F shown in FIG. 5. FIG. 4 shows two gates, thus illustrating a cross sectional view of two cells. The first source/drain region 1500a and the second source/drain region 1500b formed on opposing side surfaces of the buried trench 1100 may form the source or the drain of the transistor in the area F of FIG. 5. A nanowire 300, the dielectric film 500 and the electrode film 600 may form the capacitor in the area F.

In the DRAM, according to some embodiments of the inventive concepts, the smaller the unit cell size becomes, the higher the integration density and efficiency may be maintained. Accordingly, the high aspect ratio structure may provide a sufficient area of the capacitor. However, a top-down technology based on conventional capacitor forming methods, such as photolithography and etching process, may result in considerably increased cost because it may require use of extra ultra violet (EUV) and double patterning technology (DPT) to deal with the increased mold height and decreased hole size. Further, fabrication of a capacitor may be technically limited for a size of about 20 nm or below.

In contrast, the nanowires 300 according to some embodiments of the inventive concepts may provide a high aspect ratio capacitor structure at a low cost. That is, it may be possible to provide a semiconductor device having a smaller-sized capacitor with a higher integration density with use of bottom-up technique.

Semiconductor devices according to some embodiments of the inventive concepts will be described with reference to FIG. 6. Elements or operations overlapping with those described above with reference to FIGS. 1 to 5 may be mentioned briefly or omitted for the sake of brevity. Some embodiments of the inventive concepts illustrated in FIG. 6 may be substitutable for the area C in FIG. 4.

Figure 6:
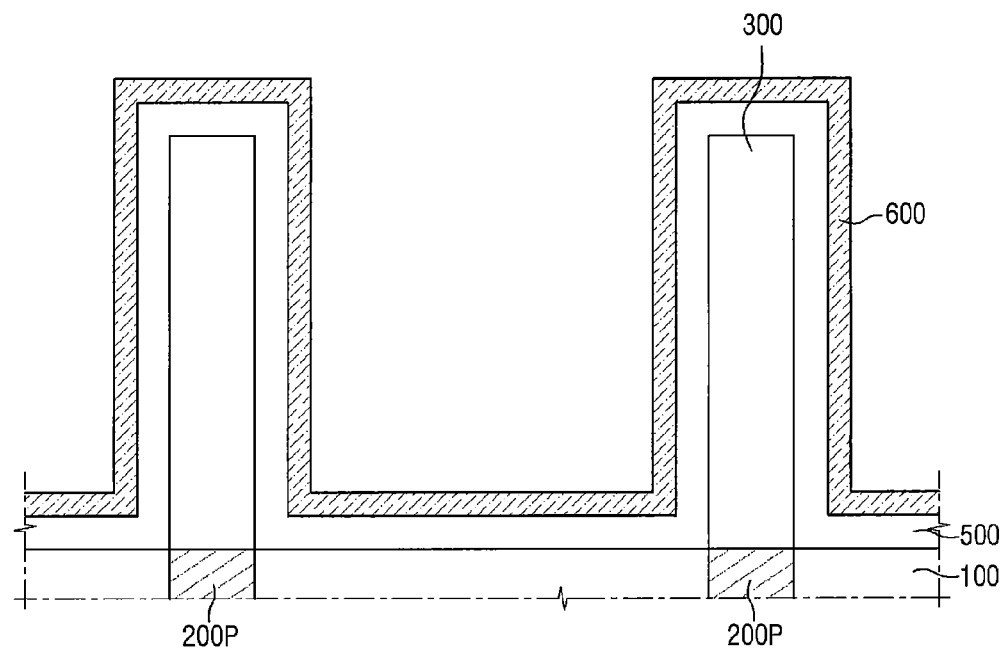
FIG. 6 is a cross sectional view schematically illustrating a semiconductor device according to some embodiments of the inventive concepts.

FIG. 6 is a cross sectional view schematically illustrating a semiconductor device according to some embodiments of the inventive concepts.

Referring to FIG. 6, a semiconductor device according to some embodiments of the inventive concepts may have the nanowires 300 on the metal layer 200P without having the seed layer 400P present on the metal layer 200P. For example, the nanowires 300 may be directly on the metal layer 200P. The metal layer 200P may pass through the interlayer insulating film 100.

The nanowires 300 may be formed on the metal layer 200P. The nanowires 300 may extend in a normal direction Z to the upper surface of the metal layer 200P. The normal direction Z may be perpendicular to the upper surface of the metal layer 200P and/or to a top surface of the interlayer insulating film 100. However, embodiments of the inventive concepts are not limited thereto.

The side surfaces of the nanowires 300 and the side surface of the metal layer 200P may have the same profile at an interface between the nanowires 300 and the metal layer 200P. That is, because the nanowires 300 grow on the metal layer 200P, the width of the nanowires 300 may be same as, or smaller than the width of the metal layer 200P. However, embodiments of the inventive concepts are not limited thereto.

Semiconductor devices according to some embodiments of the inventive concepts will be described with reference to FIG. 7. Elements or operations overlapping with those described above with reference to FIGS. 1 to 6 may be mentioned briefly or omitted for the sake of brevity. Some embodiments of the inventive concepts illustrated in FIG. 7 may be substitutable for the area C in FIG. 4.

Figure 7:
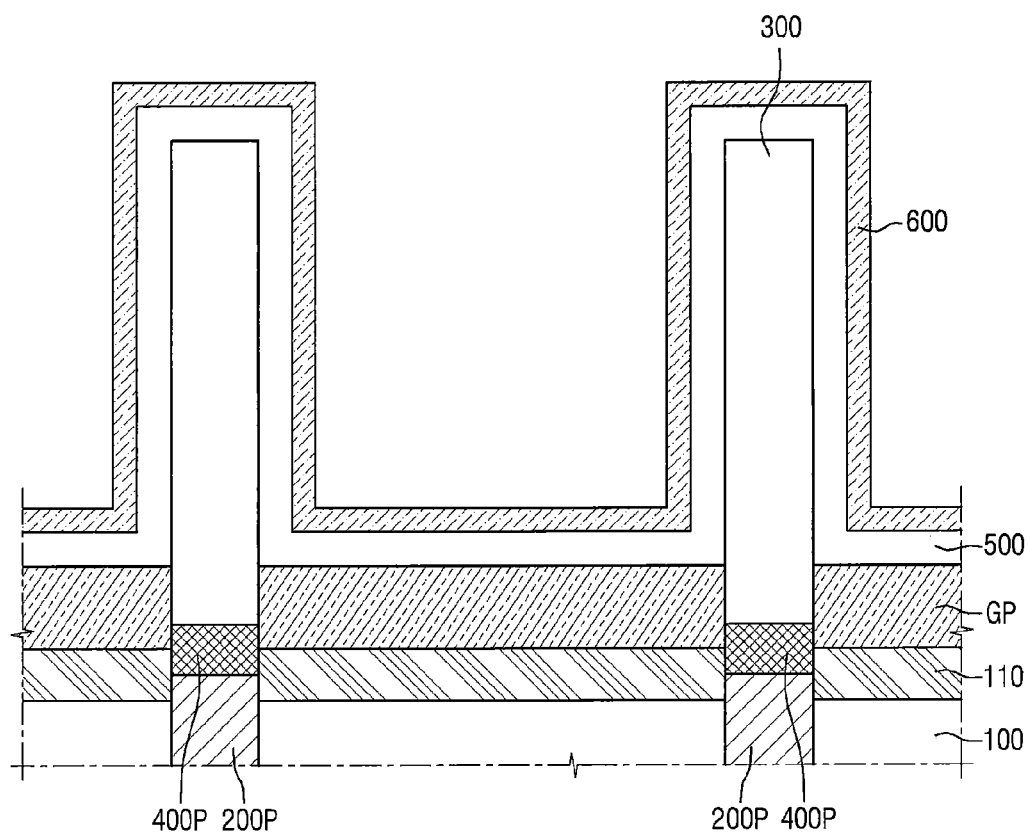
FIG. 7 is a cross sectional view schematically illustrating a semiconductor device according to some embodiments of the inventive concepts.

FIG. 7 is a cross sectional view schematically illustrating a semiconductor device according to some embodiments of the inventive concepts.

Referring to FIG. 7, a semiconductor device according to some embodiments of the inventive concepts may include an oxide layer 110 and a guide pattern GP.

The oxide layer 110 may be formed on the interlayer insulating film 100. The oxide layer 110 may surround the metal layer 200P and the seed layer 400P. The oxide layer 110 may be a layer which is formed as a result of oxidation of a metal layer to form the metal layer 200P. The oxide layer 110 may be electrically insulating. Accordingly, the oxide layer 110 may electrically separate a plurality of metal layers 200P from one another. The oxide layer 110 may also electrically separate the seed layers 400P from one another.

Overall, the stack structure of the seed layer 400P and the metal layer 200P may have satisfactory device isolation (i.e., electric isolation) by the stack structure of the interlayer insulating film 100 and the oxide layer 110.

The upper surface of the oxide layer 110 may be higher than the upper surface of the metal layer 200P, and/or lower than the upper surface of the seed layer 400P.

The guide pattern GP may be formed on the oxide layer 110. The guide pattern GP may surround the seed layer 400P and the nanowires 300. The guide pattern GP may guide an orientation of the growth of the nanowires 300. The guide pattern GP may be electrically insulating. Accordingly, the guide pattern GP may electrically separate a plurality of seed layers 400P from one another. The guide pattern GP may also electrically separate the nanowires 300 from one another. In some embodiments, the guide pattern GP may be an oxide film or a nitride film, for example.

Overall, the stack structure of the nanowires 300, the seed layer 400P and the metal layer 200P may have satisfactory device isolation (i.e., electric isolation) by the stack structure of the interlayer insulating film 100, the oxide layer 110, and the guide pattern GP.

Methods of fabricating semiconductor devices according to some embodiments of the inventive concepts will be described with reference to FIGS. 1, 2 and 8 to 11. Elements or operations overlapping with those described above with reference to FIGS. 1 to 7 may be mentioned briefly or omitted for the sake of brevity.

Figure 9:
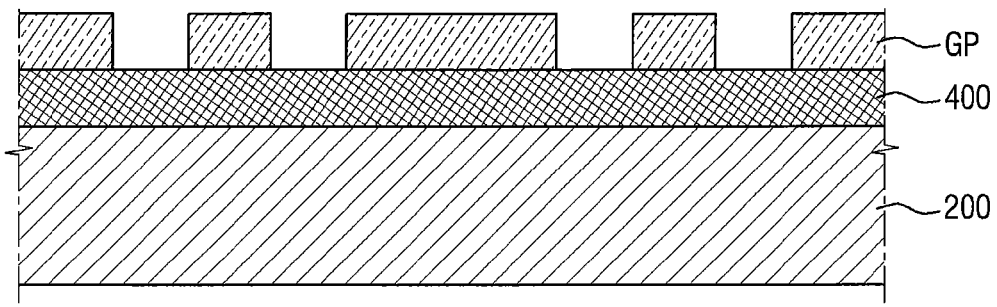
Figure 10:
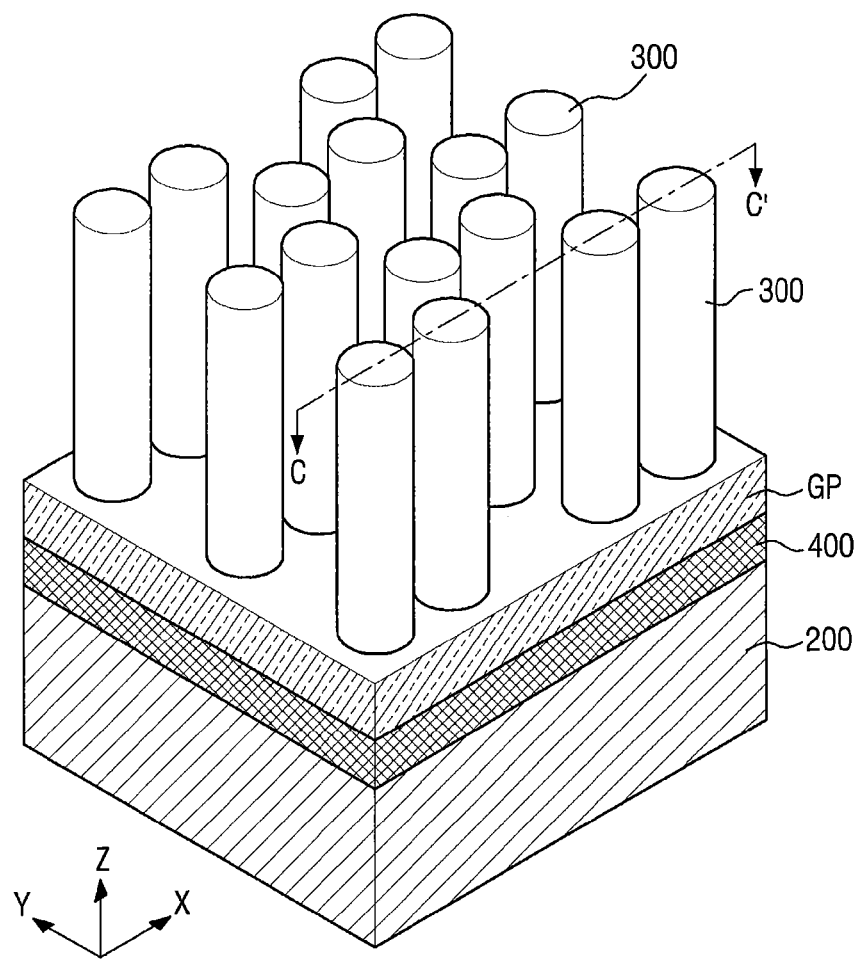
Figure 11:
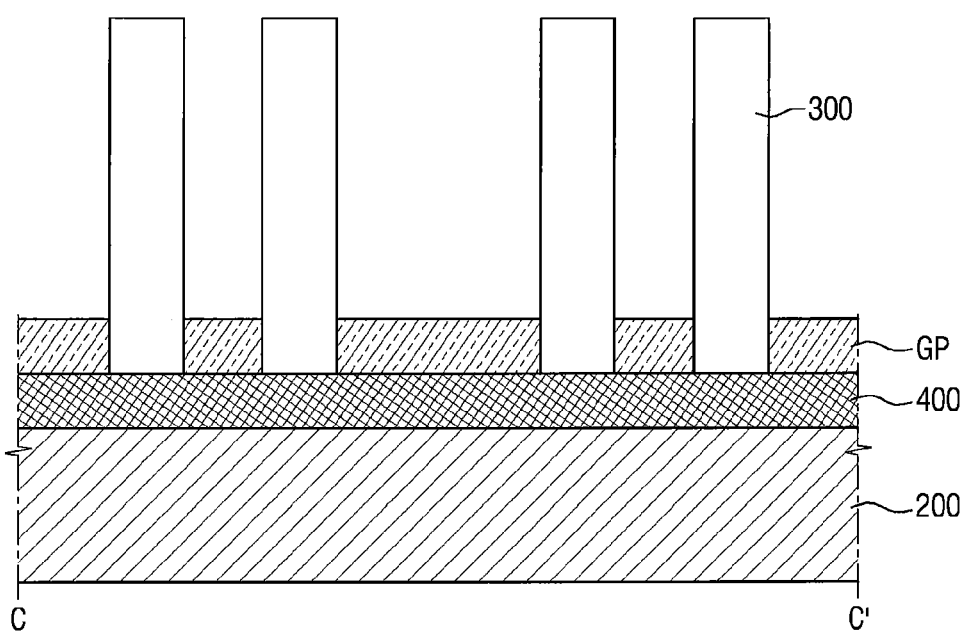

FIGS. 8 to 11 are views schematically illustrating intermediate process operations in methods of fabricating semiconductor devices according to some embodiments of the inventive concepts. FIG. 11 is a cross sectional view taken on line C-C' of FIG. 10.

Figure 8:
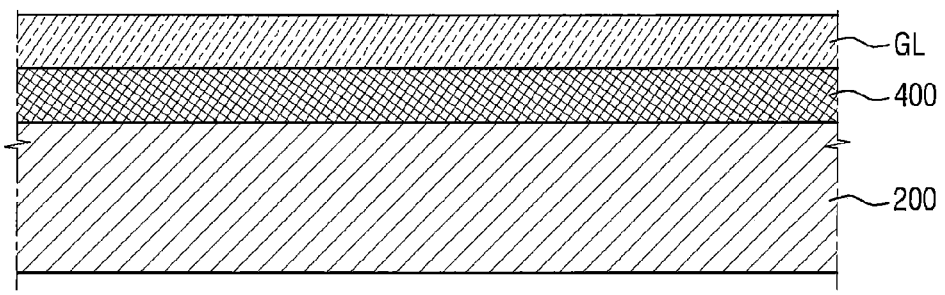
FIGS. 8 to 11 are views schematically illustrating intermediate process operations in methods of fabricating semiconductor devices according to some embodiments of the inventive concepts.

Referring to FIG. 8, the seed layer 400 may be formed on the metal layer 200. Because device isolation may not be necessary yet, the metal layer 200 and the seed layer 400 may be in one integrated structure.

The seed layer 400 may be deposited only on the metal layer 200. That is, in some embodiments, the seed layer 400 may be deposited by, for example, at least one of plasma-enhanced chemical vapor deposition (PECVD), metal organic chemical vapor deposition (MOCVD), and atomic layer deposition (ALD).

A guide layer GL may be formed on the seed layer 400. The guide layer GL may later be patterned into the guide pattern GP. The guide layer GL may be an oxide film or a nitride film, for example. That is, the guide layer GL may have electrical insulating property.

Referring to FIG. 9, the guide layer GL may be patterned into the guide pattern GP.

As the guide layer GL is patterned, only a portion of the upper surface of the seed layer 400 may be exposed. That is, the rest of the upper surface of the seed layer 400 may be covered by the guide pattern GP. The exposed upper surface of the seed layer 400 may be the area where the nanowires 300 will be grown later.

Referring to FIGS. 10 and 11, the nanowires 300 may be grown between the guide patterns GPs.

In some embodiments, the nanowires 300 may be formed, for example, by using at least one of MOCVD, PECVD, molecular beam epitaxy (MBE) and ALD. The nanowires 300 may be formed with a method which can selectively form the nanowires 300 at desired locations. That is, they may be formed only at locations where the seed layer 400 is exposed.

The initial orientation can be important for the growth orientation of the nanowires 300. The guide pattern GP may guide the orientation of initial growth of the nanowires 300, to induce the nanowire 300 growth in a normal direction to the upper surface of the seed layer 400. In principle, growing a plurality of nanowires 300 in one direction may be a challenging task, considering that the metal layer 200 includes polycrystalline metal. However, a plurality of nanowires 300 can be formed abreast in one direction by the guide pattern GP.

Referring again to FIGS. 1 and 2, the seed layer 400 and the metal layer 200 may be partially etched for device isolation. The nanowires 300 may be used as a mask to partially etch the seed layer 400 and the metal layer 200 to form the seed layer 400P and the metal layer 200P. Accordingly, the respective nanowires 300 may be electrically separated from one another. The guide pattern GP may be removed.

The interlayer insulating film 100 may then be formed to fill the side surfaces of the metal layer 200P and the seed layer 400P. In some embodiments, the upper surfaces of the interlayer insulating film 100 and the seed layer 400P may be planarized by a planarization process.

Formation of a capacitor may then be completed, for example, by forming the dielectric film 500 and the electrode film 600.

According to some embodiments of the inventive concepts, the nanowires 300 may be formed on the metal layer 200P including polycrystalline metal, to a high aspect ratio and at a low cost. Accordingly, a semiconductor device with high integration density may be provided, without requiring a high-cost process such as EUV or DPT.

Methods of fabricating semiconductor devices according to some embodiments of the inventive concepts will be described with reference to FIGS. 1, 2 and 12 to 15. Elements or operations overlapping with those described above with reference to FIGS. 1 to 11 may be mentioned briefly or omitted for the sake of brevity.

Figure 13:
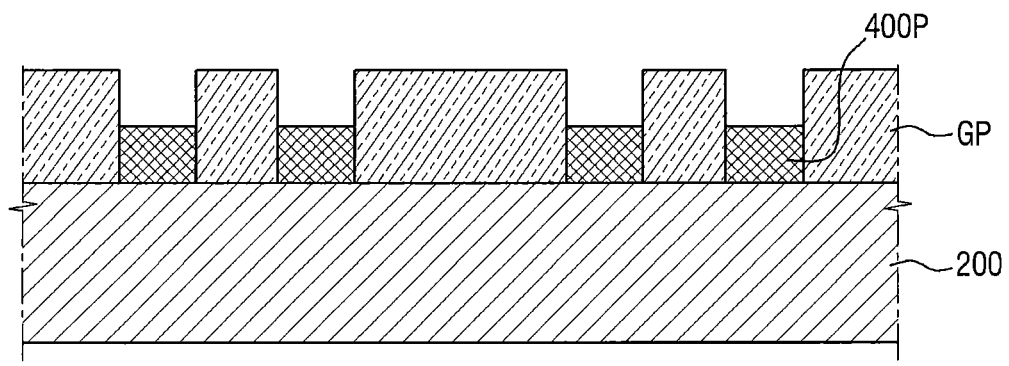
Figure 14:
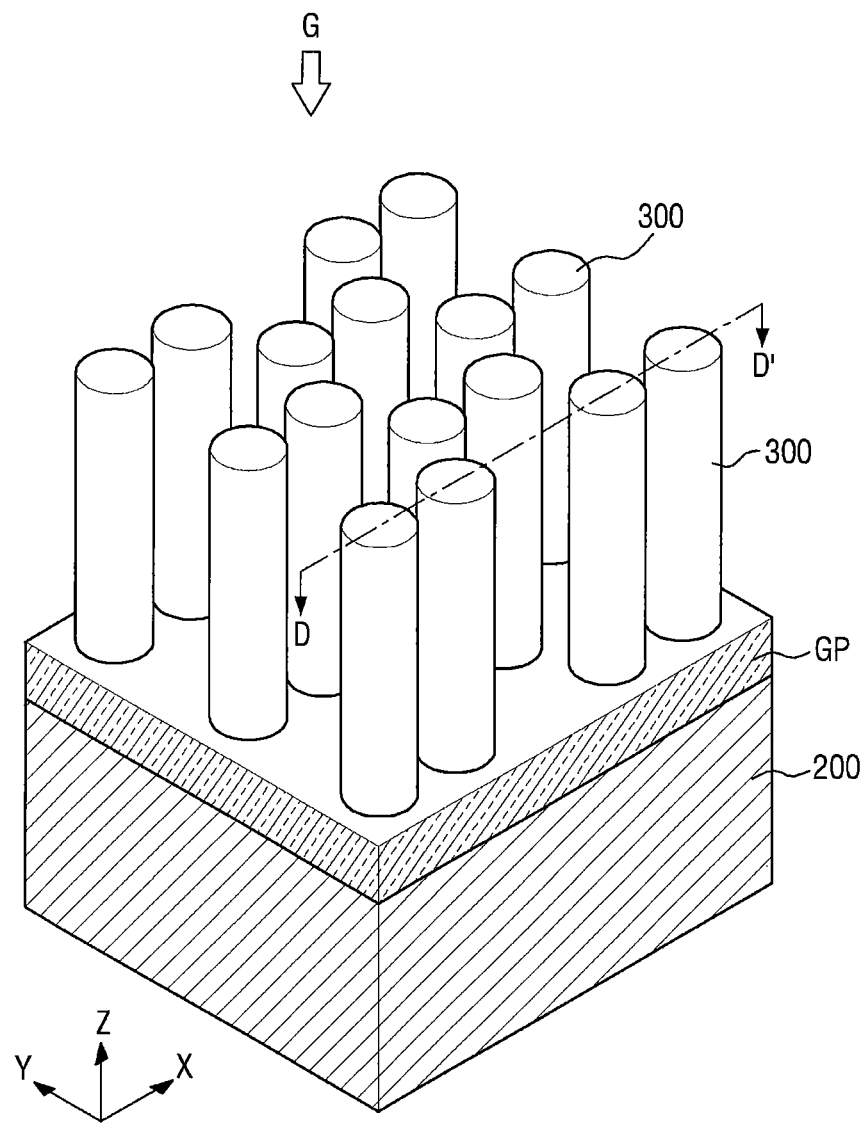
Figure 15:
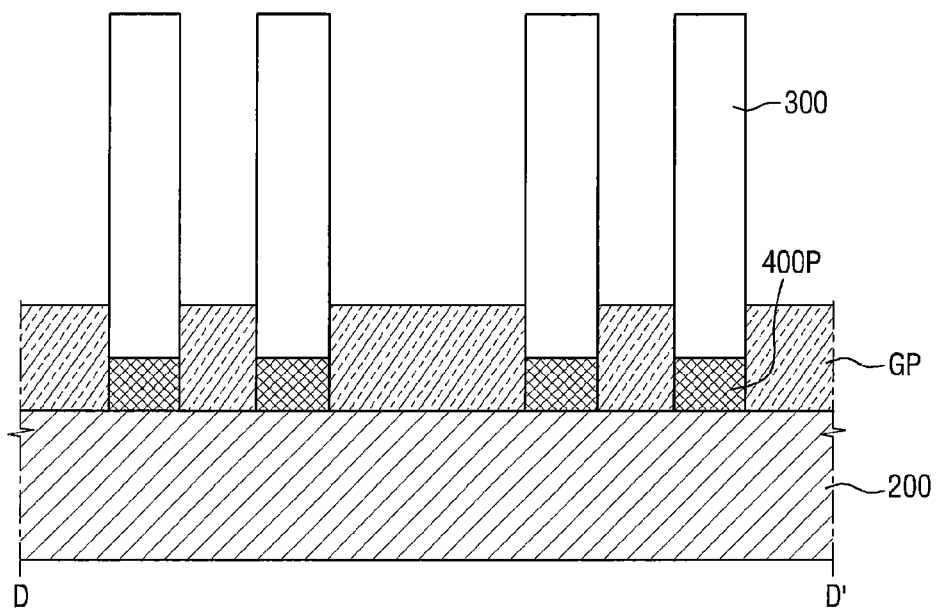

FIGS. 12 to 15 are views schematically illustrating intermediate process operations in methods of fabricating semiconductor devices according to some embodiments of the inventive concepts. FIG. 15 is a cross sectional view taken on line D-D' of FIG. 14.

Figure 12:
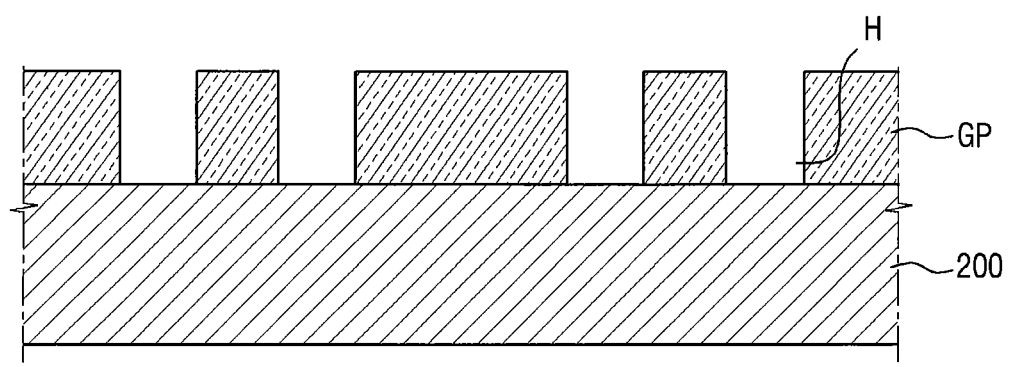
FIGS. 12 to 15 are views schematically illustrating intermediate process operations in methods of fabricating semiconductor devices according to some embodiments of the inventive concepts.

Referring to FIG. 12, the guide pattern GP may be formed on the metal layer 200.

The guide pattern GP may expose a portion of the upper surface of the metal layer 200. That is, the guide pattern GP may provide locations for growth of the nanowires 300 by covering a portion of the metal layer 200, while allowing another portion to be exposed. That is, the guide pattern GP may include holes H that expose portions of the metal layer 200.

Referring to FIG. 13, the seed layer 400P may be selectively formed on the upper surface of the metal layer 200 which is exposed by the guide pattern GP.

The seed layer 400P may be formed in the holes H of the guide pattern GP. As the seed layer 400P is formed in the holes H, the side surface of the seed layer 400P may be surrounded by the guide pattern GP.

Referring to FIGS. 14 and 15, the nanowires 300 may be grown with the seed layer 400P.

That is, the nanowires 300 may be grown on the seed layer 400P positioned between the guide patterns GPs, in a normal direction to the upper surface of the seed layer 400P. The guide pattern GP may guide the orientation of initial growth of the nanowires 300, to thus induce a final orientation of the nanowire 300 growth.

Referring to FIGS. 1 and 2, the metal layer 200 may be partially etched for device isolation. The nanowires 300 may be used as a mask to partially etch the metal layer 200. Accordingly, the respective nanowires 300 may be electrically separated from one another. The guide pattern GP may be removed.

The interlayer insulating film 100 may then be formed to fill the side surfaces of the metal layer 200P and the seed layer 400P. The upper surfaces of the interlayer insulating film 100 and the seed layer 400P may be planarized by a planarization process.

Formation of a capacitor may then be completed, for example, by forming the dielectric film 500 and the electrode film 600 on the nanowire 300 and, in some embodiments, on the interlayer insulating film 100.

According to some embodiments of the inventive concepts, the seed layer 400P may be formed within the holes H after the guide pattern GP is formed, rather than being formed under the guide pattern GP. Accordingly, as the guide pattern GP is patterned on the seed layer 400P, it may reduce or prevent damages to the seed layer 400P, and may later aid the growth of nanowires 300.

Methods of fabricating semiconductor devices according to some embodiments of the inventive concepts will be explained with reference to FIGS. 4 and 16 to 19. Elements or operations overlapping with those described above with reference to FIGS. 1 to 15 may be mentioned briefly or omitted for the sake of brevity.

FIGS. 16 to 19 are views schematically illustrating intermediate process operations in methods of fabricating semiconductor devices according to some embodiments of the inventive concepts. FIGS. 16 to 19 illustrate a portion of a semiconductor device that may correspond, for example, to area C in FIG. 4.

Figure 16:
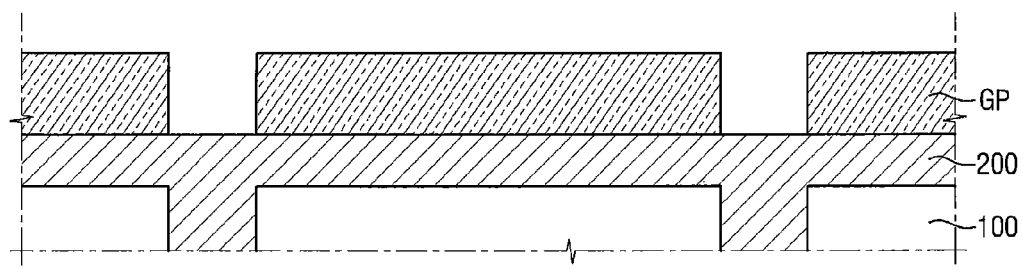
FIGS. 16 to 19 are views schematically illustrating intermediate process operations in methods of fabricating semiconductor devices according to some embodiments of the inventive concepts.

Referring to FIG. 16, the metal layer 200 may be formed on the interlayer insulating film 100.

The metal layer 200 may pass through the interlayer insulating film 100 and may cover the upper surface of the interlayer insulating film 100.

The guide pattern GP may then be formed on the metal layer 200. The guide pattern GP may expose the upper surface of the metal layer 200 at areas that overlap with the areas where the metal layer 200 passes through the interlayer insulating film 100. That is, as illustrated, the areas where the upper surface of the metal layer 200 is exposed may be aligned with the areas where the lower surface of the metal layer 200 passes through the interlayer insulating film 100.

Figure 17:
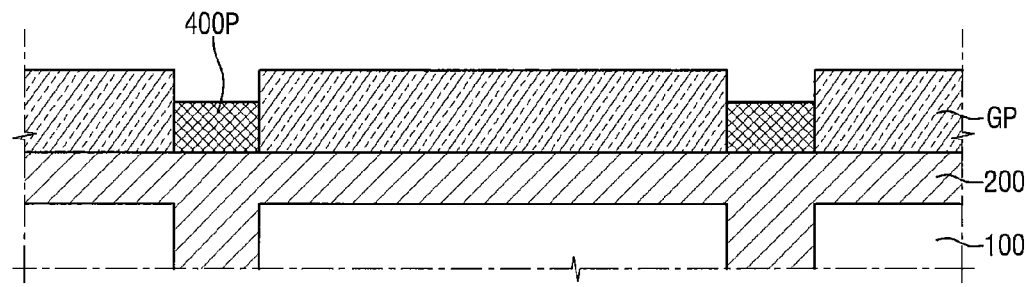

Referring to FIG. 17, the seed layer 400P may be formed at the area where the metal layer 200 is exposed by the guide pattern GP. The upper surface of the seed layer 400P may be lower than the upper surface of the guide pattern GP. That is, the seed layer 400P may partially fill the holes of the guide pattern GP.

Figure 18:
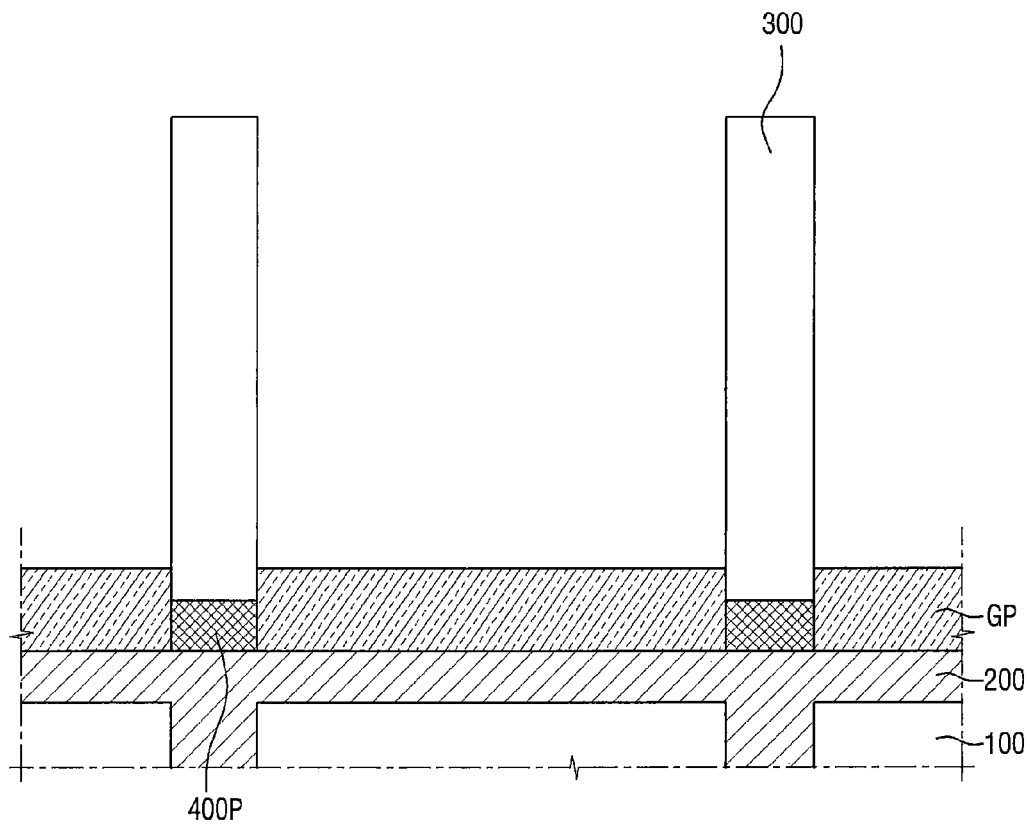

Referring to FIG. 18, the nanowires 300 may be formed on the seed layer 400P. The nanowires 300 may grow along the guide pattern GP. That is, in the initial growth, the nanowires 300 may grow along the guide pattern GP, and continue to grow along the orientation of the initial growth even when the nanowires 300 have higher upper surfaces than the guide pattern GP. Accordingly, the height of the upper surfaces of the nanowires 300 may exceed the height of the guide pattern GP.

Figure 19:
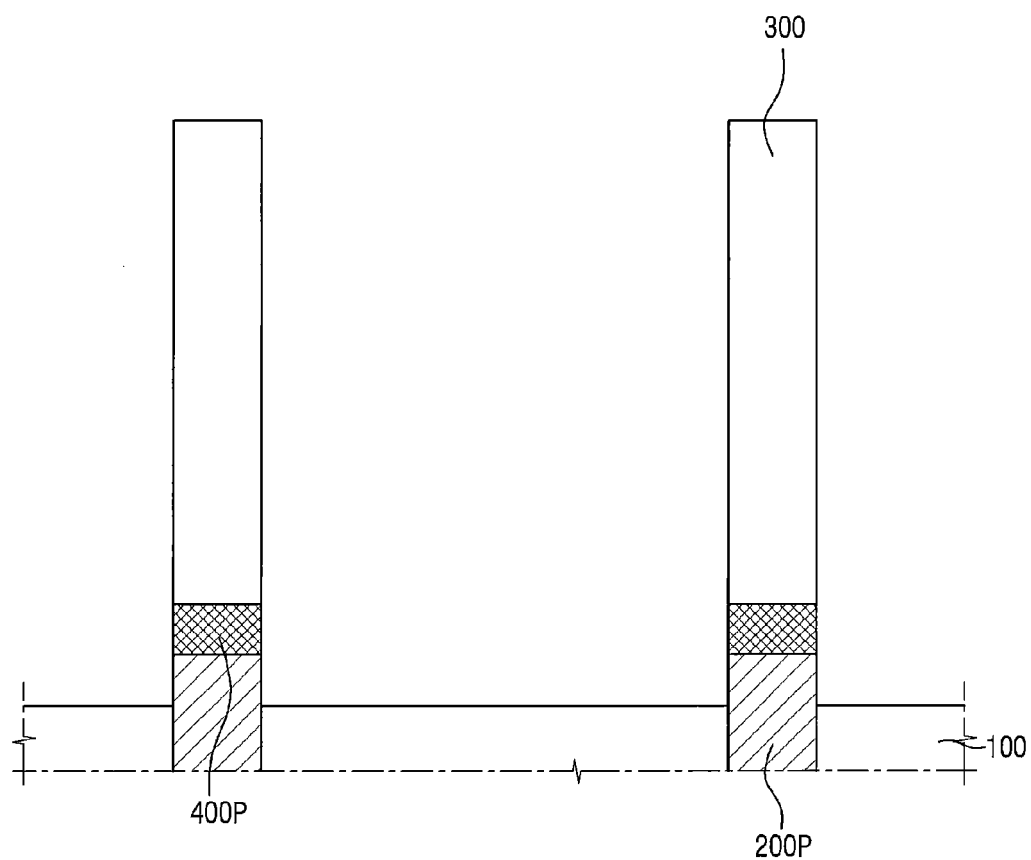

Referring to FIG. 19, the guide pattern GP and the metal layer 200 may be removed with the nanowires 300 used as a mask.

In some embodiments, the guide pattern GP may be entirely removed. That is, the guide pattern GP may be entirely removed as it does not overlap with the nanowires 300. In contrast, an area of the metal layer 200 overlapping with the seed layer 400P may not be removed, but may remain to form the metal layer 200P. In some embodiments, the upper surface of the interlayer insulating film 100 may be lower than the upper surface of the metal layer 200P.

Referring to FIG. 4, the interlayer insulating film 100 may be additionally formed to fill the side surfaces of the metal layer 200P and the seed layer 400P. The newly-formed interlayer insulating film 100 may be the same material as the previously-formed interlayer insulating film 100. However, embodiments of the inventive concepts are not limited thereto.

The upper surfaces of the interlayer insulating film 100 and the seed layer 400P may then be planarized by a planarization process.

Formation of a capacitor may then be completed, for example, by forming the dielectric film 500 and the electrode film 600.

Methods of fabricating semiconductor devices according to some embodiments of the inventive concepts will be explained with reference to FIGS. 4, 6, 16, 17, 20 and 21. Elements or operations overlapping with those described above with reference to FIGS. 1 to 19 may be mentioned briefly or omitted for the sake of brevity.

Figure 20:
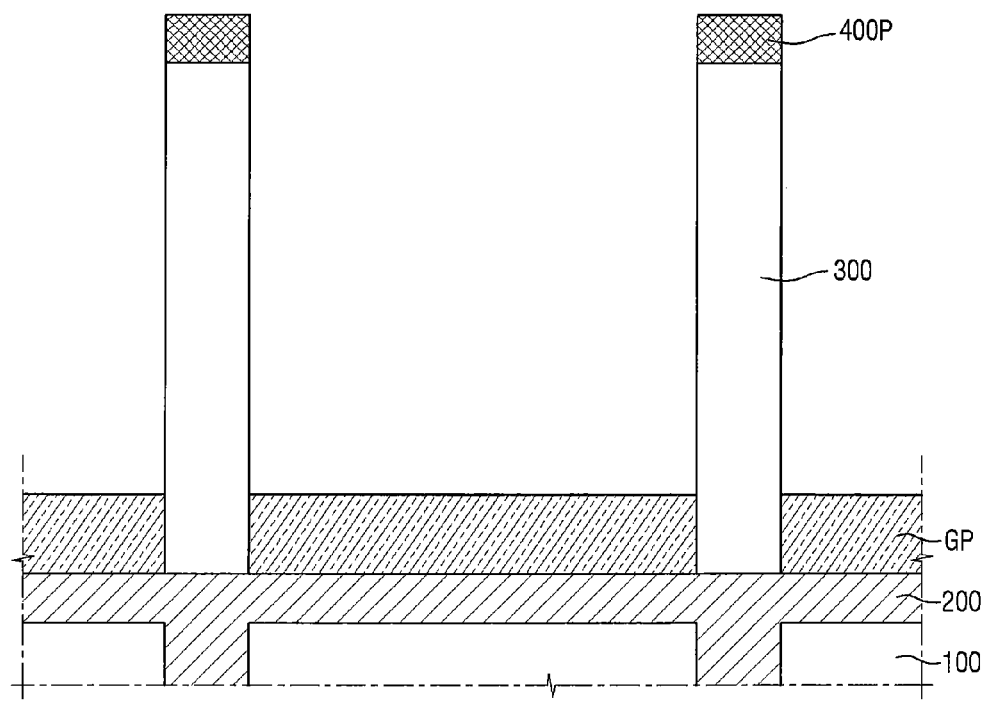
FIGS. 20 and 21 are views schematically illustrating intermediate process operations in methods of fabricating semiconductor devices according to some embodiments of the inventive concepts.
Figure 21:
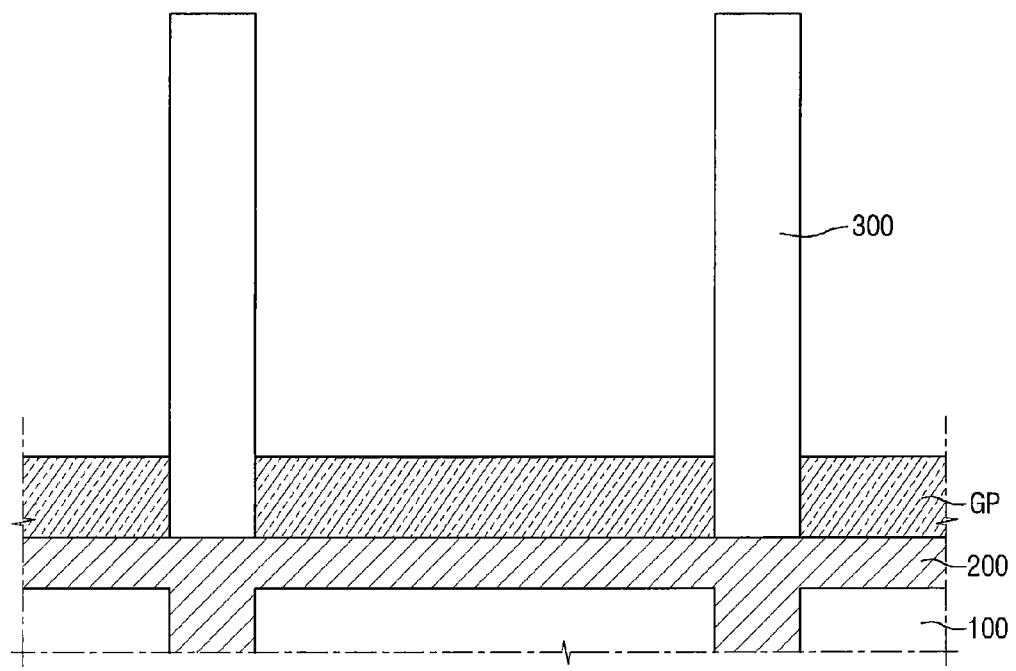

FIGS. 20 and 21 are views schematically illustrating intermediate process operations in methods of fabricating semiconductor devices according to some embodiments of the inventive concepts. FIGS. 20 and 21 illustrate a portion of a semiconductor device that may correspond, for example, to area C in FIG. 4.

Referring to FIG. 17, the seed layer 400P may be formed. The seed layer 400P may be metal material. That is, the seed layer 400P may include at least one of Ag, Au and Al, for example.

Referring to FIG. 20, the nanowires 300 may be formed. The nanowires 300 may be formed under the seed layer 400P. When the seed layer 400P is metal material, the nanowires 300 may grow under the seed layer 400P. That is, the growing nanowires 300 may continue growing upward, placing the seed layer 400P thereabove. Accordingly, the nanowires 300 may grow, lifting up the seed layer 400P. As a result, the seed layer 400P may be positioned above the nanowires 300.

Referring to FIG. 21, the seed layer 400P may be removed. The seed layer 400P may be removed from the nanowires 300 so that the nanowires 300 are formed directly on the metal layer 200. The seed layer 400P may not remain in the subsequent structure.

Referring to FIG. 6, the metal layer 200 may be partially etched for device isolation. The nanowires 300 may be used as a mask to partially etch the metal layer 200 to form the metal layer 200P. Accordingly, the respective nanowires 300 may be electrically separated from one another. The guide pattern GP may also be removed.

The interlayer insulating film 100 may then be additionally formed to fill the side surfaces of the metal layer 200P. The upper surfaces of the interlayer insulating film 100 and the metal layer 200P may be planarized by a planarization process.

Formation of a capacitor may then be completed, for example, by forming the dielectric film 500 and the electrode film 600.

Methods of fabricating semiconductor devices according to some embodiments of the inventive concepts will be described with reference to FIGS. 4, 7 and 22 to 27. Elements or operations overlapping with those described above with reference to FIGS. 1 to 21 may be mentioned briefly or omitted for the sake of brevity.

FIGS. 22 to 27 are views schematically illustrating intermediate process operations in methods of fabricating semiconductor devices according to some embodiments of the inventive concepts; FIGS. 22 to 27 illustrate a portion of a semiconductor device that may correspond, for example, to area C in FIG. 4.

Figure 22:
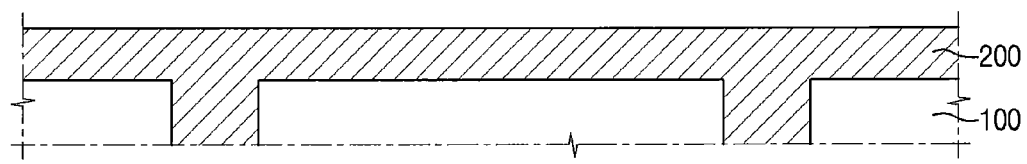
FIGS. 22 to 27 are views schematically illustrating intermediate process operations in methods of fabricating semiconductor devices according to some embodiments of the inventive concepts.

Referring to FIG. 22, the metal layer 200 may be formed on the interlayer insulating film 100. The metal layer 200 may pass through the interlayer insulating film 100. The metal layer 200 may cover the upper surface of the interlayer insulating film 100.

Referring to FIGS. 23 to 27, guide pattern GP may then be formed on the metal layer 200. The guide pattern GP may expose the upper surface of the metal layer 200 at an area that overlaps with the area where the metal layer 200 passes through the interlayer insulating film 100. That is, the area where the upper surface of the metal layer 200 is exposed may be aligned with the area where the lower surface of the metal layer 200 passes through the interlayer insulating film 100.

Figure 23:
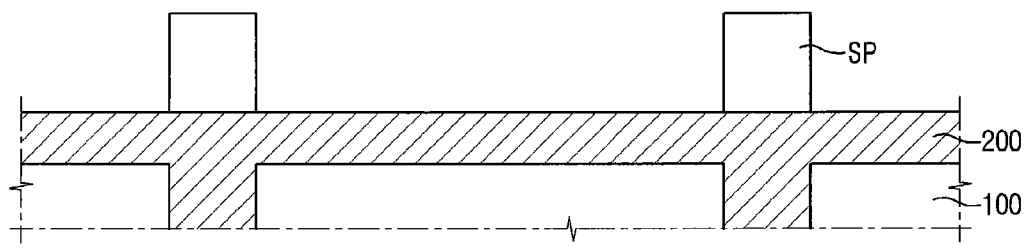

Referring to FIG. 23, a sacrificial pattern SP may be formed on the metal layer 200. The sacrificial pattern SP may be formed on the metal layer 200. The sacrificial pattern SP may partially expose the upper surface of the metal layer 200. The sacrificial pattern SP may be formed in alignment with an area where the metal layer 200P passes through the interlayer insulating film 100. Such alignment may be made for the purpose of device isolation of the nanowires 300 later.

Figure 24:
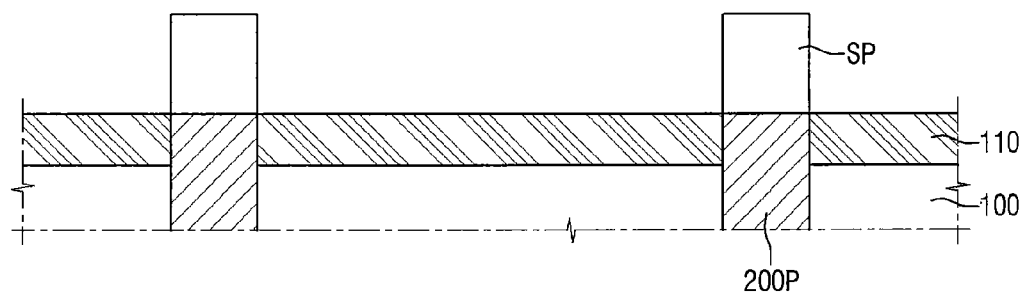

Referring to FIG. 24, the oxide layer 110 may be formed, for example, as a result of oxidizing the metal layer 200. The oxide layer 110 may be formed as a result of oxidizing the metal layer 200, turning the area non-overlapping with the sacrificial pattern SP into the oxide layer 110. However, the area overlapping with the sacrificial pattern SP may remain as the metal layer 200P. Accordingly, the heights of the metal layer 200P and the oxide layer 110 may be same.

Figure 25:
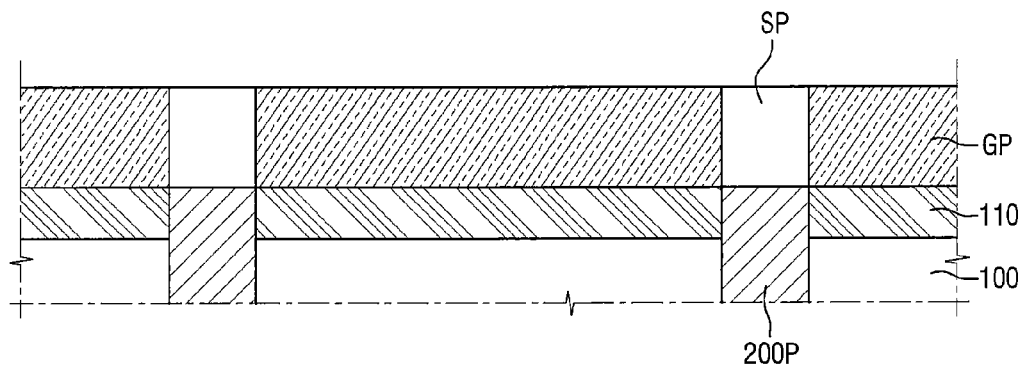

Referring to FIG. 25, the guide pattern GP may be formed on the oxide layer 110. The guide pattern GP may fill the area where the sacrificial pattern SP is absent. In some embodiments, the upper surface of the guide pattern GP and the upper surface of the sacrificial pattern SP may have the same height.

Figure 26:
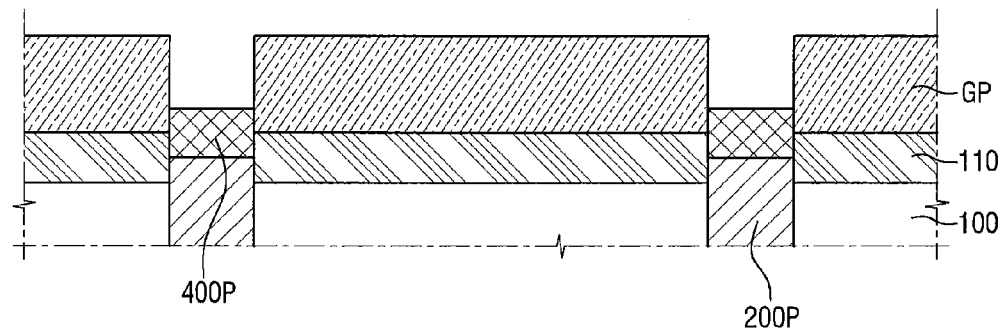

Referring to FIG. 26, the sacrificial pattern SP may be removed. The sacrificial pattern SP may include a material having etch selectivity with the guide pattern GP. Accordingly, the guide pattern GP may be kept from being removed while the sacrificial pattern SP is removed. Upon removal of the sacrificial pattern SP, a portion of the metal layer 200P may also be removed.

The seed layer 400P may be formed at sites where the sacrificial pattern SP is removed. When a portion of the metal layer 200P is removed along with the removal of the sacrificial pattern SP, the lower surface of the seed layer 400P may be lower than the lower surface of the guide pattern GP. Further, the upper surface of the seed layer 400P may be higher than the lower surface of the guide pattern GP.

Figure 27:
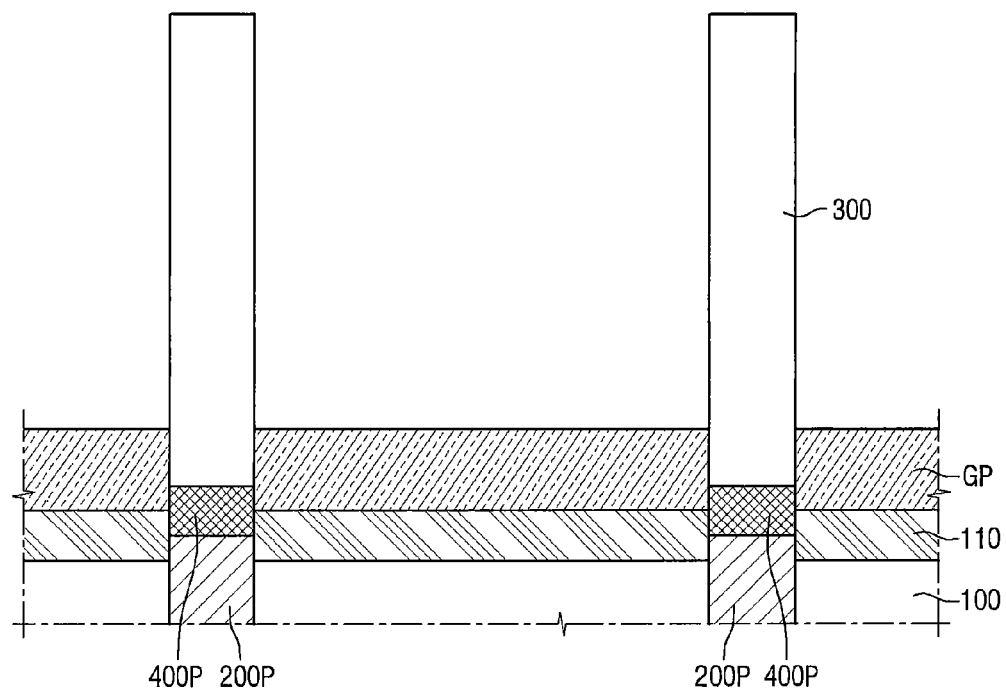

Referring to FIG. 27, the nanowires 300 may be grown. The nanowires 300 may be formed on the seed layer 400P. The orientation of growth of the nanowires 300 may be guided based on the guide pattern GP.

Referring to FIG. 7, formation of a capacitor may then be completed, for example, by forming the dielectric film 500 and the electrode film 600.

Methods of fabricating semiconductor devices according to some embodiments of the inventive concepts will be explained with reference to FIGS. 4 and 28 to 31. Elements or operations overlapping with those described above with reference to FIGS. 1 to 27 may be mentioned briefly or omitted for the sake of brevity.

FIGS. 28 to 31 are views schematically illustrating intermediate process operations in methods of fabricating semiconductor devices according to some embodiments of the inventive concepts. FIGS. 28 to 31 illustrate a portion of a semiconductor device that may correspond, for example, to area E in FIG. 4.

Figure 28:
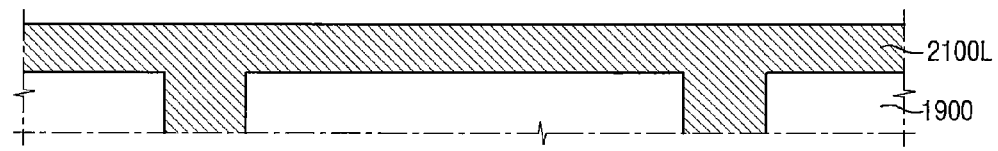
FIGS. 28 to 31 are views schematically illustrating intermediate process operations in methods of fabricating semiconductor devices according to some embodiments of the inventive concepts.

Referring to FIG. 28, a contact plug film 2100L may be formed on a second insulating layer 1900. The contact plug film 2100L may pass through the second insulating layer 1900 and may cover the upper surface of the second insulating layer 1900. The contact plug film 2100L may include polysilicon.

Figure 29:
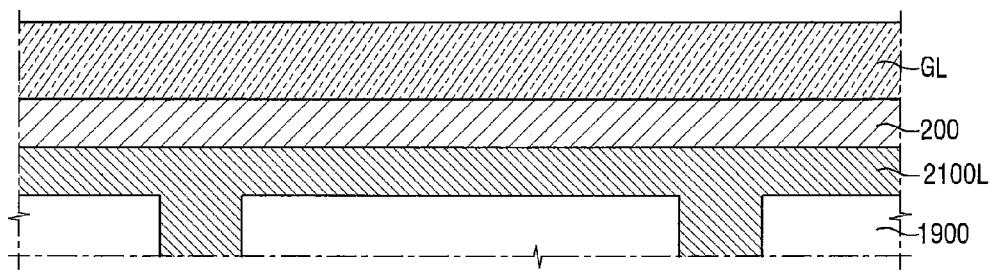

Referring to FIG. 29, the metal layer 200 may be formed on the contact plug film 2100L. A guide layer GL may be formed on the metal layer 200.

Figure 30:
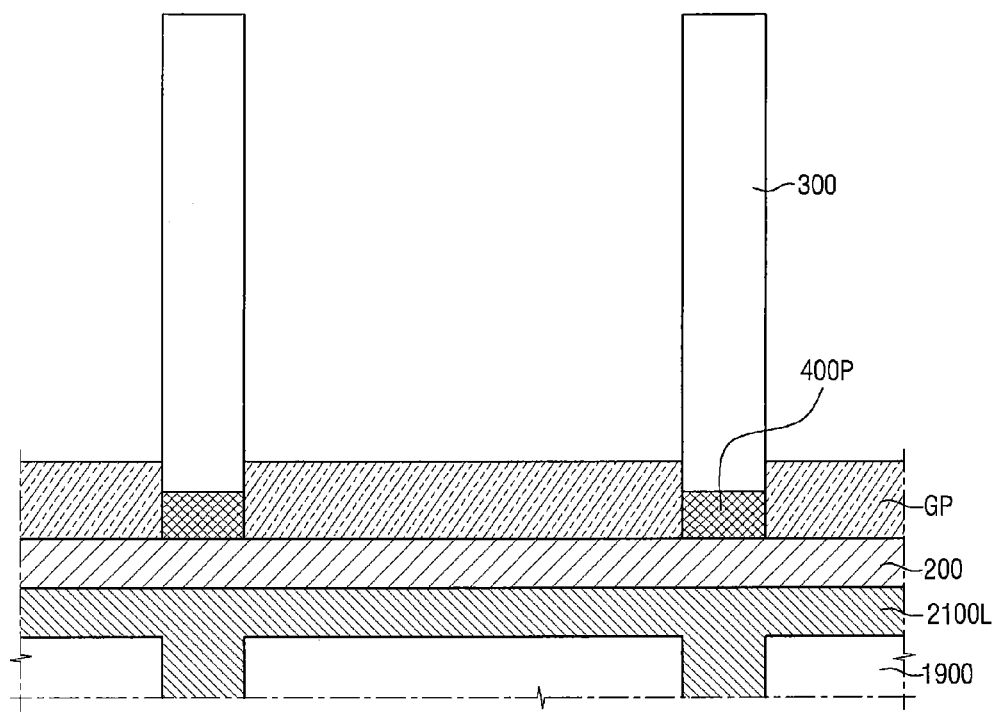

Referring to FIG. 30, the guide layer GL may be patterned into the guide pattern GP. At this time, a portion of the upper surface of the metal layer 200 may be exposed. The seed layer 400P may then be formed so as to overlap with the upper surface of the metal layer 200 which may be exposed by the guide pattern GP. The nanowires 300 may then be formed on the seed layer 400P.

Figure 31:
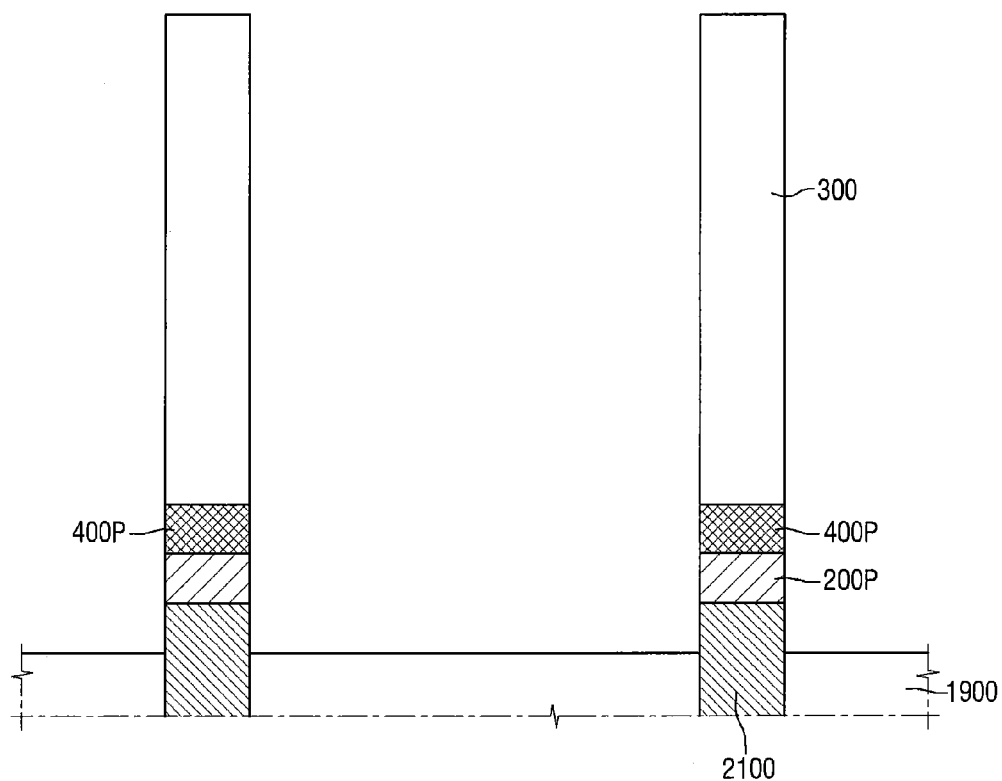

Referring to FIG. 31, the guide pattern GP, the metal layer 200, and the contact plug film 2100L may be removed with the nanowires 300 as a mask. The guide pattern GP may be entirely removed. That is, the guide pattern GP may be entirely removed as it does not overlap with the nanowires 300. In contrast, a portion of the metal layer 200, that is, the metal layer 200P, and a portion of the contact plug film 2100L, that is, the contact plug 2100 may remain unremoved at an area overlapping with the seed layer 400P. The upper surface of the second interlayer insulating film 1900 may be lower than the upper surface of the metal layer 200P. In some embodiments, the upper surface of the second interlayer insulating film 1900 may be lower than the lower surface of the metal layer 200P.

Referring to FIG. 4, the interlayer insulating film 100 may be formed on the second insulating layer 1900, thus filling the side surfaces of the metal layer 200P and the seed layer 400P. The interlayer insulating film 100 may be the same material as the second insulating layer 1900. However, embodiments of the inventive concepts are not limited thereto. The upper surfaces of the interlayer insulating film 100 and the seed layer 400P may then be planarized by a planarization process. Formation of a capacitor may then be completed, for example, by forming the dielectric film 500 and the electrode film 600. As a result, in some embodiments, device isolation of the contact plug 2100, the metal layer 200P and so on can be completed at once, and simple processing can thus be achieved.

Figure 32:
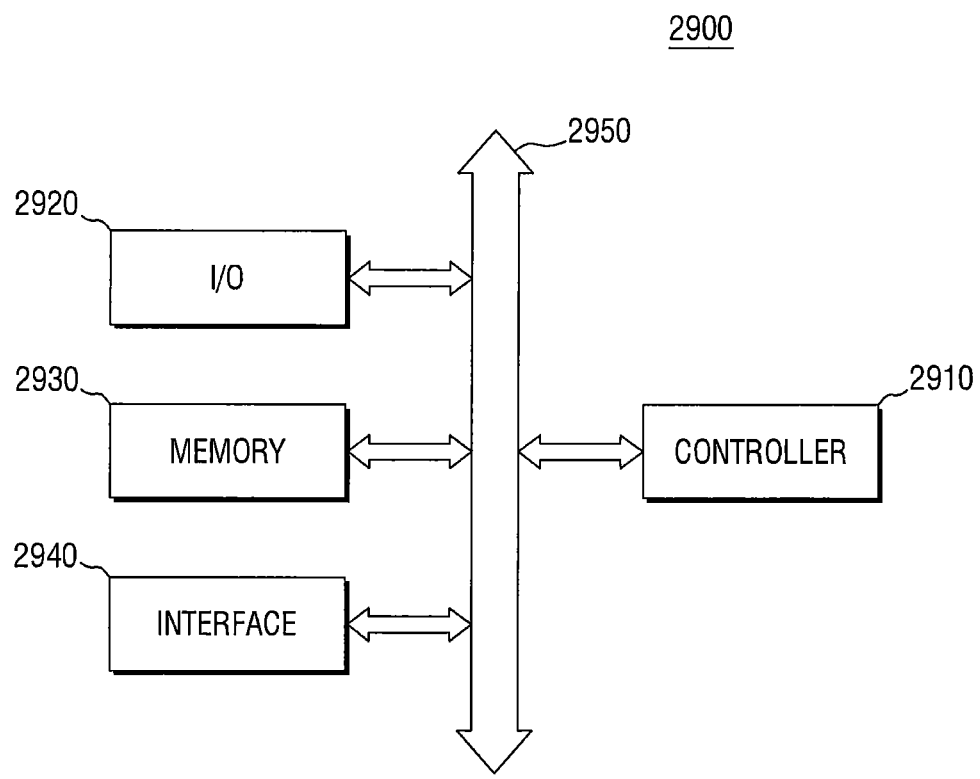
FIG. 32 is a block diagram of an electronic system comprising a semiconductor device fabricated according to a fabricating method of a semiconductor device according to some embodiments of the inventive concepts.

FIG. 32 is a block diagram of an electronic system comprising a semiconductor device fabricated according to a fabricating method of a semiconductor device according to some embodiments of the inventive concepts.

Referring to FIG. 32, an electronic system 2900 according to some embodiments of the inventive concepts may include a controller 2910, an input/output (I/O) device 2920, a memory device 2930, an interface 2940 and a bus 2950. The controller 2910, the I/O device 2920, the memory device 2930 and/or the interface 2940 may be connected with one another via the bus 2950. The bus 2950 may correspond to a path through which data travels.

The controller 2910 may include at least one of microprocessor, digital signal process, micro controller and logic devices capable of performing functions similar to the functions of those mentioned above. The I/O device 2920 may include a keypad, a keyboard, a display device, and so on. The memory device 2930 may store data and/or commands. The memory device 2930 may include a semiconductor device according to some exemplary embodiments. The memory device 2930 may include DRAM. The interface 2940 may perform a function of transmitting or receiving data to or from communication networks. The interface 2940 may be wired or wireless. For example, the interface 2940 may include an antenna and/or a wired/wireless transceiver.

In some embodiments, the electronic system 2900 may be a personal digital assistant (PDA) portable computer, a web tablet, a wireless phone, a mobile phone, a digital music player, a memory card, or an electronic product that is capable of transmitting and/or receiving data in wireless environment.

Figure 33:
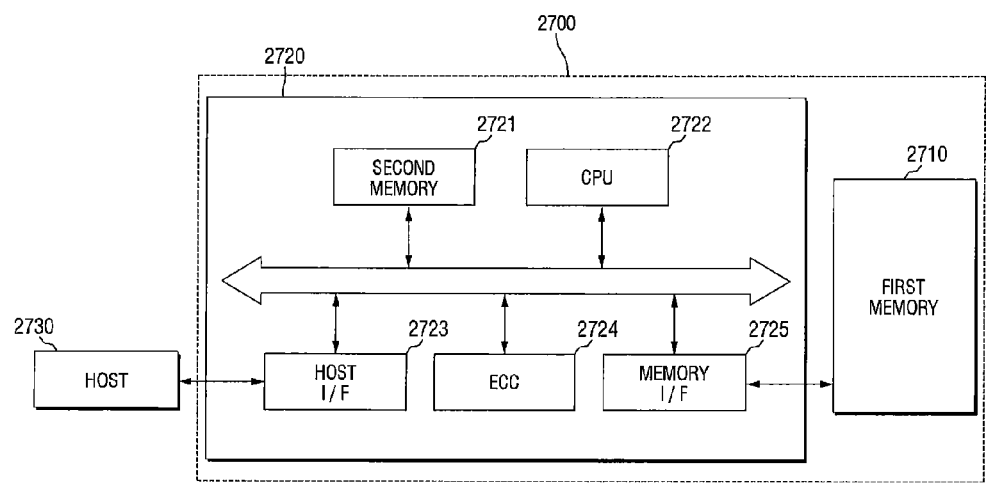
FIG. 33 is a block diagram of a memory card comprising a semiconductor device fabricated according to a fabricating method of a semiconductor device according to some embodiments of the inventive concepts.

FIG. 33 is a block diagram of a memory card comprising a semiconductor device fabricated according to a fabricating method of a semiconductor device according to some embodiments of the inventive concepts.

Referring to FIG. 33, a first memory 2710 comprising a semiconductor device fabricated according to some embodiments of the inventive concepts may be employed in a memory card 2700. The memory card 2700 may include a memory controller 2720 to control data exchange between a host 2730 and the first memory 2710.

A second memory 2721 may be used as a cache memory of a central processing unit 2722. The second memory 2721 may include a semiconductor device according to some embodiments. A host interface 2723 may provide a protocol for the host 2730 to access the memory card 2700 and exchange data. An error correction code unit 2724 may detect an error in the data read from the first memory 2710 and may correct it. A memory interface 2725 may interface with the first memory 2710. The central processing unit 2722 may perform overall control operation associated with the data exchange of a memory controller 2720.

Figure 34:
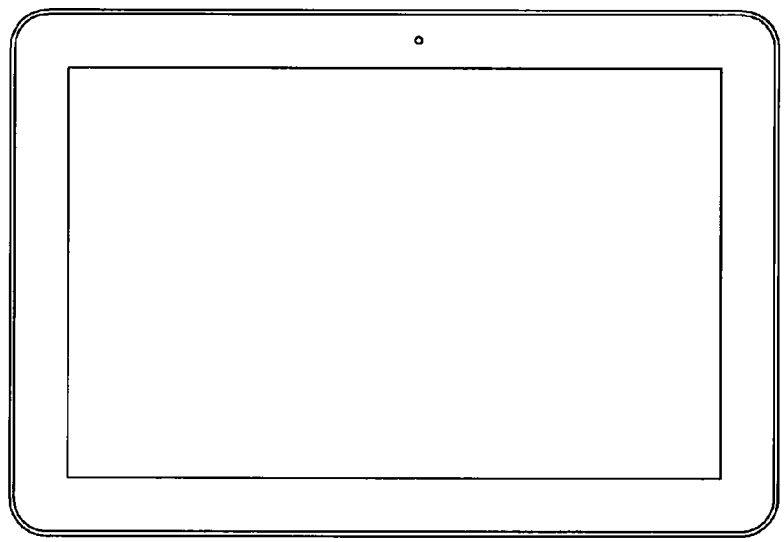
FIGS. 34 to 36 illustrate semiconductor systems which may apply therein a semiconductor device according to some embodiments of the inventive concepts.
Figure 35:
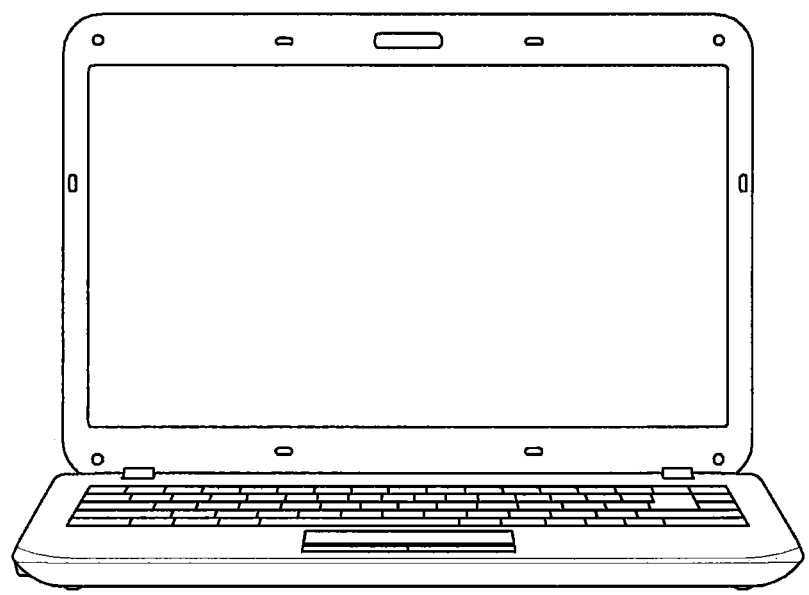
Figure 36:
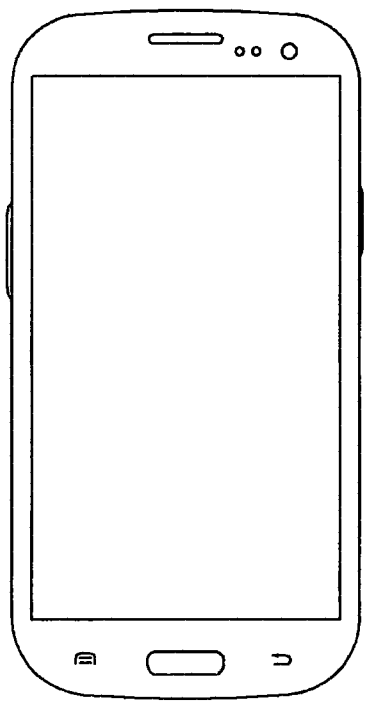

FIGS. 34 to 36 illustrate semiconductor systems which may apply therein a semiconductor device according to some embodiments of the inventive concepts.

FIG. 34 illustrates a tablet PC 3200, FIG. 35 illustrates a laptop computer 3300, and FIG. 36 illustrates a smartphone 3400. According to some embodiments of the inventive concepts, the semiconductor device may be used in these devices, i.e., in the tablet PC 3200, the laptop computer 3300 or the smartphone 3400.

Further, it may be apparent to those skilled in the art that the semiconductor device according to some embodiments of the inventive concepts may be applicable to other integrated circuit devices not illustrated herein. That is, while only the tablet PC 3200, the laptop computer 3300 and the smartphone 3400 are exemplified herein as a semiconductor system according to some embodiments of the inventive concepts, the embodiments of the semiconductor system are not limited to any of the examples given above.

In some exemplary embodiments, the semiconductor system may be realized as a computer, an ultra mobile PC (UMPC), a workstation, a net-book, a personal digital assistant (PDA), a portable computer, a wireless phone, a mobile phone, an e-book, a portable multimedia player (PMP), a portable game player, a navigation device, a black box, a digital camera, a three-dimensional television, a digital audio recorder, a digital audio player, a digital picture recorder, a digital picture player, a digital video recorder, a digital video player, and so on.

While the present inventive concepts have been particularly shown and described with reference to exemplary embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A semiconductor device, comprising:
   a substrate,
   a metal layer on the substrate;
   a seed layer on the metal layer;
   a nanowire comprising a pillar shape on the seed layer;
   a dielectric film conformally covering the nanowire; and
   an electrode film on the dielectric film.

2. The semiconductor device of claim 1, wherein a shape of a lower surface of the nanowire conforms to a shape of an upper surface of the seed layer.

3. The semiconductor device of claim 1, wherein the nanowire comprises at least one of ZnO, doped ZnO, GaAs, InP, and Si.

4. The semiconductor device of claim 1, wherein the seed layer comprises at least one of graphene, nanocrystalline graphene and amorphous carbon.

5. The semiconductor device of claim 1, further comprising an interlayer insulating film,
   wherein the metal layer passes through the interlayer insulating film.

6. The semiconductor device of claim 1, further comprising a guide pattern through which the nanowire passes,
   wherein a distance from an upper surface of the guide pattern to the substrate is less than a distance from the upper surface of the nanowire to the substrate.

7. The semiconductor device of claim 6, further comprising an oxide layer under the guide pattern, the oxide layer surrounding a portion of the metal layer that is adjacent to the seed layer.

8. The semiconductor device of claim 7, wherein a distance from an upper surface of the oxide layer to the substrate is greater than a distance from an upper surface of the metal layer to the substrate.

9. The semiconductor device of claim 1, further comprising:
   a gate electrode within the substrate;
   a first source/drain region and a second source/drain region in the substrate on opposing side surfaces of the gate electrode; and
   a bit line on the substrate,
   wherein the bit line is electrically connected to the first source/drain region, and
   wherein the metal layer is electrically connected to the second source/drain region.

10. The semiconductor device of claim 9, further comprising a contact plug between the metal layer and the second source/drain region that electrically connects the metal layer to the second source/drain region, the contact plug comprising polysilicon.

11. A semiconductor device, comprising:
    a substrate;
    a gate electrode in the substrate;
    a first source/drain region and a second source/drain region in the substrate on opposing sides of the gate electrode;
    a bit line on the substrate that is electrically connected to the first source/drain region;
    a metal layer that is electrically connected to the second source/drain region;
    a nanowire comprising a pillar shape on the metal layer;
    a dielectric film conformally covering the nanowire; and
    an electrode film on the dielectric film.

12. The semiconductor device of claim 11, further comprising a seed layer between the metal layer and the nanowire.

13. The semiconductor device of claim 11, further comprising:
    a device isolating region in the substrate that defines an active region in the substrate; and
    a trench in the active region,
    wherein the gate electrode fills at least a portion of the trench.

14. The semiconductor device of claim 11,
    wherein the nanowire comprises a lower portion and an upper portion on the lower portion,
    wherein the upper portion is surrounded by the dielectric film, and
    wherein the semiconductor device further comprises a guide pattern surrounding the lower portion.

15. The semiconductor device of claim 14, further comprising an oxide layer between the guide pattern and the substrate, the oxide layer surrounding at least an upper portion of the metal layer.

16. A semiconductor device, comprising:
    a substrate;
    a device isolating region in the substrate that defines an active region in the substrate;
    a gate electrode in the active region of the substrate;
    a first source/drain region and a second source/drain region in the active region of the substrate on opposing side surfaces of the gate electrode;
    a bit line on the substrate that is electrically connected to the first source/drain region;
    a contact plug comprising polysilicon on the substrate that is electrically connected to the second source/drain region;
    a metal layer comprising a polycrystalline metal on the contact plug;
    a seed layer comprising a carbon-based material on the metal layer;

a nanowire on the seed layer that extends away from the substrate;

a dielectric film conformally covering the nanowire; and an electrode film on the dielectric film.

17. The semiconductor device of claim 16, further comprising:

a guide pattern on the substrate that surrounds a lower portion of the nanowire that is adjacent to the seed layer, the guide pattern comprising an electrically insulating material.

18. The semiconductor device of claim 17, further comprising:

an oxide layer between the guide pattern and the substrate, the oxide layer surrounding at least an upper portion of the metal layer that is adjacent the seed layer, the oxide layer comprising the polycrystalline metal of the metal layer that has been oxidized to be electrically insulating.

19. The semiconductor device of claim 16, wherein the gate electrode is a first gate electrode, the contact plug is a first contact plug, the metal layer is a first metal layer, the seed layer is a first seed layer, and the nanowire is a first nanowire, the semiconductor device further comprising:

a second gate electrode in the active region of the substrate;

a third source/drain region in the active region of the substrate on an opposing side surface of the second gate electrode from the first source/drain region;

a second contact plug comprising polysilicon on the substrate that is electrically connected to the third source/drain region;

a second metal layer comprising the polycrystalline metal on the second contact plug;

a second seed layer comprising the carbon-based material on the second metal layer; and a second nanowire on the second seed layer that extends away from the substrate;

wherein the dielectric film conformally covers the second nanowire, and wherein the electrode film is on the dielectric film surrounding each of the first nanowire and the second nanowire.

20. The semiconductor device of claim 19, wherein a first word line comprising the first gate electrode and a second word line comprising the second gate electrode each extend parallel to each other in a first direction, wherein the bit line extends in a second direction that is perpendicular to the first direction, and wherein the active area extends in a third direction that forms an acute angle with respect to each of the first and second directions.

* * * * *